(12) United States Patent
Tokiwa

(10) Patent No.: US 9,318,212 B2
(45) Date of Patent: Apr. 19, 2016

(54) NONVOLATILE MEMORY DEVICE CHANGING A PERIOD OF AN INTERNAL CLOCK

(71) Applicant: Kabushiki Kaisha Toshiba, Minato-ku (JP)

(72) Inventor: Naoya Tokiwa, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 79 days.

(21) Appl. No.: 14/017,563

(22) Filed: Sep. 4, 2013

(65) Prior Publication Data

US 2014/0226408 A1 Aug. 14, 2014

(30) Foreign Application Priority Data

Feb. 13, 2013 (JP) ................................. 2013-025734

(51) Int. Cl.
| | |
|---|---|
| *G11C 16/00* | (2006.01) |
| *G11C 16/32* | (2006.01) |
| *G11C 7/20* | (2006.01) |
| *G11C 7/22* | (2006.01) |
| *G11C 29/02* | (2006.01) |
| *G11C 29/04* | (2006.01) |
| *G11C 29/44* | (2006.01) |

(52) U.S. Cl.
CPC *G11C 16/32* (2013.01); *G11C 7/20* (2013.01); *G11C 7/222* (2013.01); *G11C 29/028* (2013.01); *G11C 16/00* (2013.01); *G11C 2029/0407* (2013.01); *G11C 2029/4402* (2013.01); *G11C 2207/2254* (2013.01)

(58) Field of Classification Search
CPC .. G06F 1/08; G11C 2029/4402; G11C 16/32; G11C 29/028; G11C 2029/0407
USPC ........................................................ 365/185.18
See application file for complete search history.

(56) References Cited

U.S. PATENT DOCUMENTS

| | | | | |
|---|---|---|---|---|
| 7,388,782 | B2 | 6/2008 | Tokiwa | |
| 7,450,435 | B2 * | 11/2008 | Tran et al. | ................ 365/185.29 |
| 7,515,470 | B2 | 4/2009 | Tokiwa | |
| 7,813,214 | B2 * | 10/2010 | Noichi | ........................ 365/233.1 |
| 8,810,321 | B2 * | 8/2014 | Choi | ............................. 331/1 A |
| 2006/0133156 | A1 * | 6/2006 | Tran et al. | ................ 365/185.29 |
| 2009/0034332 | A1 * | 2/2009 | Noichi | ..................... 365/185.09 |
| 2010/0097858 | A1 * | 4/2010 | Tokiwa et al. | ........... 365/185.05 |
| 2013/0187722 | A1 * | 7/2013 | Choi | ............................. 331/1 A |

FOREIGN PATENT DOCUMENTS

| | | |
|---|---|---|
| JP | 2001-176290 | 6/2001 |
| JP | 2011-198466 A | 10/2011 |

OTHER PUBLICATIONS

Office Action issued Jul. 8, 2015 in Japanese Patent Application No. 2013-025734 (with English language translation).

\* cited by examiner

*Primary Examiner* — Richard Elms
*Assistant Examiner* — Xiaochun L Chen
(74) *Attorney, Agent, or Firm* — Oblon, McClelland, Maier & Neustadt, L.L.P.

(57) ABSTRACT

A nonvolatile memory device includes a core unit and a peripheral circuit unit. The core unit is configured to be capable of storing data. The peripheral circuit unit is configured to program and read the data to and from the core unit. The peripheral circuit unit is configured to generate an internal clock having a first period. The peripheral circuit unit is configured to change the first period to be a second period after being input a first command and a second command within an interval.

12 Claims, 27 Drawing Sheets

| STATE | CMDPOR | INITOSC | CALIBFAIL | F_OSC |
|---|---|---|---|---|
| NORMAL OPERATION | L | * | * | F_OSCdefault |
| PRIOR TO CALIBRATION | H | H | * | FIXED VALUE Initial Value |
| AFTER CALIBRATION | H | L | L | CORRECTED VALUE Trimmed Value |
| CALIBRATION FAILURE | H | L | H | SAFETY VALUE Safety Value |

FIG. 4

| STATE | CMDPOR | INITOSC | CALIBFAIL | DiffSEL | F_OSC | |
|---|---|---|---|---|---|---|
| NORMAL OPERATION | L | * | * | * | F_OSCdefault | |
| PRIOR TO CALIBRATION | H | H | * | * | FIXED VALUE | InitialValue |
| AFTER CALIBRATION (INAPPROPRIATE) | H | L | L | L | FIXED VALUE | InitialValue |
| AFTER CALIBRATION (APPROPRIATE) | H | L | L | H | CORRECTED VALUE | Trimmed Value |
| CALIBRATION FAILURE | H | L | H | * | SAFETY VALUE | Safety Value |

FIG. 18

NONVOLATILE MEMORY DEVICE CHANGING A PERIOD OF AN INTERNAL CLOCK

CROSS-REFERENCE TO RELATED APPLICATIONS

This application is based upon and claims the benefit of priority from Japanese Patent Application No. 2013-025734, filed on Feb. 13, 2013; the entire contents of which are incorporated herein by reference.

FIELD

Embodiments described herein relate generally to a nonvolatile memory device.

BACKGROUND

Nonvolatile memory devices such as NAND flash memory, etc., include a cell array that stores data, and a peripheral circuit that performs operations such as the programming, reading, erasing, etc., of the data to and from the cell array. An oscillator that generates a clock signal which is used as a reference of the operations is provided in the peripheral circuit.

BRIEF DESCRIPTION OF THE DRAWINGS

FIG. 4 is a drawing showing a relationship between an operating state of the nonvolatile memory device according to the first embodiment, signals input to an oscillation period generation circuit, and a code signal F_OSC that is output;

FIG. 13A shows the case where the oscillation is slower than the design; and FIG. 13B shows the case where the oscillation is faster than the design;

FIG. 18 is a drawing showing a relationship between an operating state of the nonvolatile memory device according to the second embodiment, signals input to an oscillation period generation circuit, and a code signal F_OSC that is output;

DETAILED DESCRIPTION

In general, according to one embodiment, a nonvolatile memory device includes a core unit and a peripheral circuit unit. The core unit is configured to be capable of storing data. The peripheral circuit unit is configured to program and read the data to and from the core unit. The peripheral circuit unit is configured to generate an internal clock having a first period. The peripheral circuit unit is configured to change the first period to be a second period by after being input a first command and a second command within an interval.

In general, according to one embodiment, a nonvolatile memory device includes a core unit and a peripheral circuit unit. The core unit is configured to store data. The peripheral circuit unit is configured to program and read the data to and from the core unit. The peripheral circuit unit is configured to control a period of an internal clock by being input a first command and a second command from the outside.

Embodiments of the invention will now be described with reference to the drawings.

First, a first embodiment will be described.

In the embodiment, the reading operation is implemented by autonomously correcting the internal clock when the information stored in the fuse region (hereinbelow, also called the "fuse data") is read in the startup of a nonvolatile memory device without using correction information of the internal clock included in the fuse data. Thereby, the fuse data can be read reliably in a short period of time. In the specification hereinbelow, the operation of reading the fuse data in the startup of the nonvolatile memory device is called the "power-on read"; and the series of operations for autonomously correcting the internal clock is called the "calibration". The power-on read interval includes the calibration interval and the interval of reading the fuse data using the internal clock corrected by the calibration. After reading the fuse data, the normal operation is implemented by further correcting the internal clock using the period correction information of the internal clock included in the fuse data.

Figure 1:
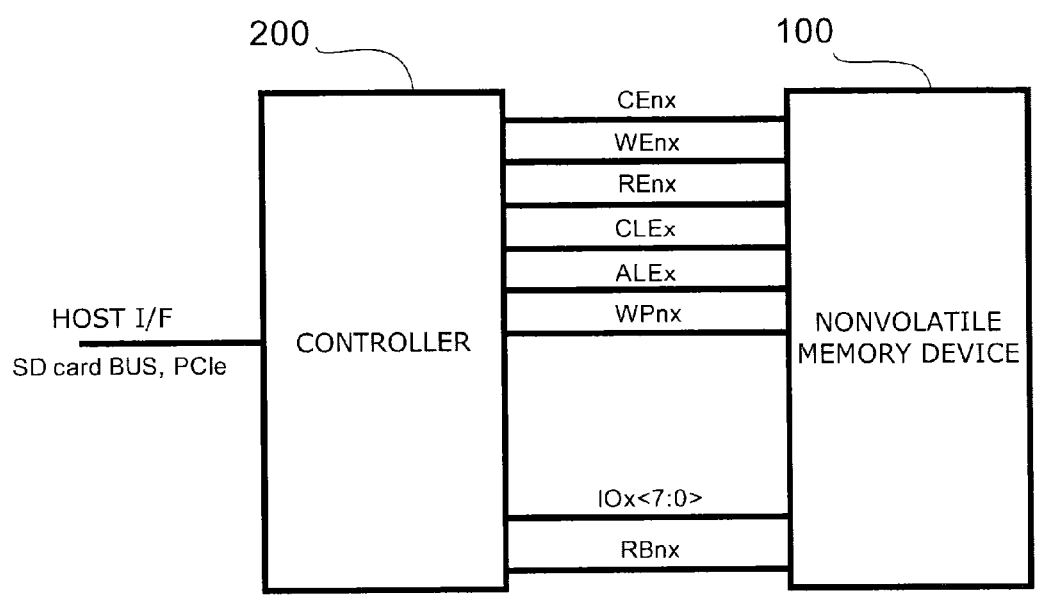
FIG. 1 is a block diagram showing a nonvolatile memory device and a controller connected to the nonvolatile memory device according to a first embodiment.

FIG. 1 is a block diagram showing the nonvolatile memory device and a controller connected to the nonvolatile memory device according to the embodiment.

As shown in FIG. 1, the nonvolatile memory device 100 (hereinbelow, also called simply the "device 100") according to the embodiment is connected to the controller 200. The controller 200 is connected to a host interface (host I/F), e.g., a bus such as SD card BUS, PCI express, etc. A chip enable signal CEnx, a write enable signal WEnx, a read enable signal REnx, a command latch enable signal CLEx, an address latch enable signal ALEx, and a write protect signal WPnx are transmitted from the controller 200 to the device 100. A ready/busy signal RBnx is transmitted from the device 100 to the controller 200. A bidirectional bus IOx<7:0> that transmits data is connected between the device 100 and the controller 200.

Figure 2:
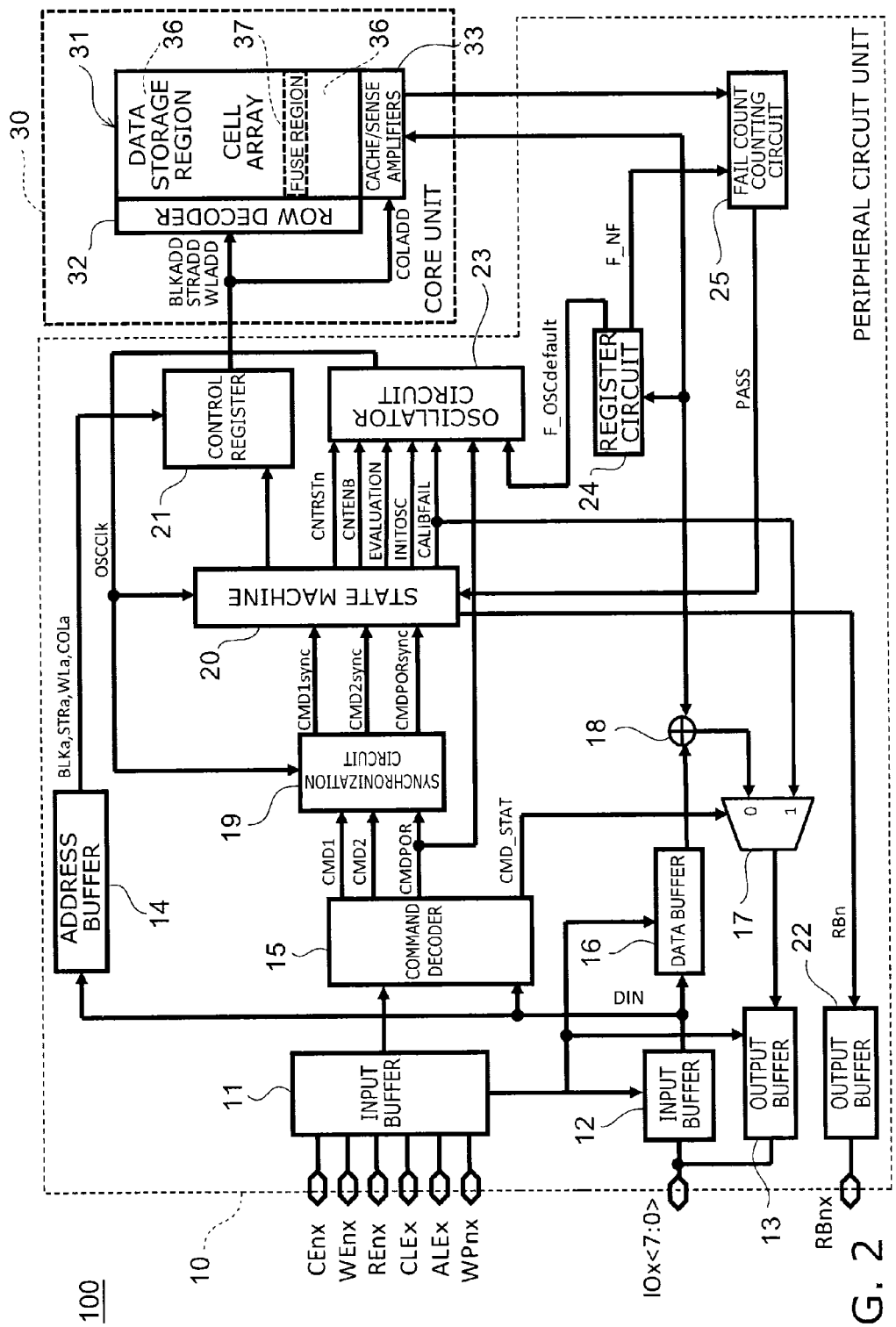
FIG. 2 is a block diagram showing the nonvolatile memory device according to the first embodiment.

FIG. 2 is a block diagram showing the nonvolatile memory device according to the embodiment.

As shown in FIG. 2, a core unit 30 that stores the data and a peripheral circuit unit 10 that performs operations such as the programming, reading, erasing, etc., of the data to and from the core unit 30 are provided in the device 100.

A cell array 31, a row decoder 32, and cache/sense amplifiers 33 are provided in the core unit 30. The cell array 31 includes: a data storage region 36 where the programming, reading, and erasing of the data is possible; and a fuse (FUSE) region 37 where information that is unique to the device 100 such as information relating to the defective bits, period correction information of the clock signal, etc., is programmed prior to shipment from the factory and stored, and from which such information can only be read after shipment from the factory. In other words, in the device 100 after shipment from the factory, the reprogrammable normal data is stored in the data storage region; and the read-only fuse data is stored in the fuse region 37. The proportion of the fuse region 37 in the entire cell array 31 is, for example, about 1 block per 512 blocks. The row decoder 32 selects the block and the potential of each of the word lines of the cell array 31. The cache/sense amplifiers 33 include the cache (not shown) that stores the data that is programmed to the cell array 31 and the data that is read from the cell array 31, and the sense amplifiers (not shown) that sense the potential of each of the bit lines. The sense amplifiers are not limited to a configuration that senses the potential and may have a configuration that senses a cell current flowing in the cell array 31.

The configuration of the peripheral circuit unit 10 will now be described.

An input buffer 11, an input buffer 12, an output buffer 13, an address buffer 14, a command decoder 15, a data buffer 16, a selection circuit 17, a direction selection circuit 18, a synchronization circuit 19, a state machine 20, a control register 21, an output buffer 22, an oscillator circuit 23, a register circuit 24, and a fail count counting circuit 25 are provided in the peripheral circuit unit 10.

The output signals of the controller 200, i.e., the chip enable signal CEnx, the write enable signal WEnx, the read enable signal REnx, the command latch enable signal CLEx, the address latch enable signal ALEx, and the write protect signal WPnx, are input to the input buffer 11 via the signal pins. The input buffer 11 recognizes each of the states of the command input state, the address input state, the data input state, the write protect state, and the chip selected/unselected state by sensing the logical value of these signals and outputs the recognition result to the input buffer 12, the output buffer 13, the command decoder 15, and the data buffer 16.

The input buffer 12 is connected to the bidirectional bus IOx<7:0>; and an output signal of the input buffer 11 is input to the input buffer 12. Thereby, the input buffer 12 is controlled by the output signal of the input buffer 11 and outputs data that is input via the bidirectional bus IOx<7:0> to the address buffer 14, the command decoder 15, and the data buffer 16 as a data signal DIN.

The output buffer 13 is connected to the bidirectional bus IOx<7:0>; and the output signal of the input buffer 11 and an output signal of the selection circuit 17 are input to the output buffer 13. Thereby, the output buffer 13 is controlled by the output signal of the input buffer 11 and outputs the data that is read from the cell array 31 to the bidirectional bus IOx<7:0> at a prescribed timing.

The address buffer 14 receives the data signal DIN from the input buffer 12 and temporarily holds the address data included in the data signal DIN. The address buffer 14 separates the address data into a block address BLKa, a string address STRa, a word line address WLa, and a column address COLa and outputs these to the control register 21 according to the input order or the input bit position.

The command decoder 15 is controlled by an output signal of the input buffer 11, receives the data signal DIN from the input buffer 12, and outputs command signals when it is sensed that the data signal DIN is in a prescribed state. Specifically, the command decoder 15 outputs a command CMD1 and a command CMD2 to indicate a reference time tSTD to the synchronization circuit 19, outputs a power-on read command CMDPOR to indicate being in the power-on read interval to the synchronization circuit 19 and the oscillator circuit 23, and outputs a status read command CMD_STAT to the selection circuit 17.

The data buffer 16 is controlled by the output signal of the input buffer 11, receives the data signal DIN from the input buffer 12, temporarily holds program data included in the data signal DIN, and outputs the program data to the cache/sense amplifiers 33 by way of the direction selection circuit 18.

The selection circuit 17 selects either a failure signal CALIBFAIL or read-out data that is output from the cache/sense amplifiers 33 according to the state of the status read command CMD_STAT that is output from the command decoder 15 and outputs the failure signal CALIBFAIL or the read-out data to the output buffer 13.

The direction selection circuit 18 selects whether to transfer the data from the data buffer 16 to the cache/sense amplifiers 33 or transfer the data from the cache/sense amplifiers 33 to the selection circuit 17.

The synchronization circuit 19 outputs to the state machine 20 the command signals related to the operation of the state machine 20 that are output from the command decoder 15 by synchronizing the signals with an internal clock OSCClk. Although normally, the timing at which the command signal switches depends on the timing of the switching of the value of an external signal corresponding to the command signal, e.g., the write enable signal WEnx that is input from the controller 200, this timing is converted into a signal that rises at the timing at which the internal clock OSCClk switches, e.g., the rise timing of the internal clock OSCClk. Specifically, the synchronization circuit 19 receives the command CMD1 from the command decoder 15, generates a synchronous signal CMD1sync, receives the command CMD2, generates a synchronous signal CMD2sync, receives the power-on read command CMDPOR, and generates a synchronous signal CMDPORsync.

The state machine 20 is a control circuit that manages the operations of the device 100 such as the programming, reading, erasing, etc., of the data. Therefore, the internal clock OSCClk from the oscillator circuit 23 is input to the state machine 20; and the state machine 20 outputs an operation instruction signal to the control register 21. Further, when in the power-on read of the embodiment described below, the state machine 20 corrects the period of the internal clock OSCClk that is output by the oscillator circuit 23 without using the correction information of the internal clock stored in the fuse region 37. Therefore, the state machine 20 receives several signals from the synchronization circuit 19 and outputs several control signals to the oscillator circuit 23.

Specifically, the synchronous signals CMD1sync, CMD2sync, and CMDPORsync are input to the state machine 20 from the synchronization circuit 19; and a signal PASS from the fail count counting circuit 25 is input to the state machine 20. Then, the state machine 20 performs prescribed calculations based on these signals and outputs a counter reset signal CNTRSTn, a count enable signal CNTENB, a count hold signal EVALUATION, and a fixed value signal INITOSC to the oscillator circuit 23. The counter reset signal CNTRSTn is a signal to reset the count value of a counter circuit 23a (referring to FIG. 3) of the oscillator circuit 23 to "0". The count enable signal CNTENB is a signal that causes the counter circuit 23a to start counting. The count hold signal EVALUATION is a signal that causes the counter circuit 23a to end the counting and hold the count value at this point in time. The fixed value signal INITOSC is a signal that provides a fixed value Initial Value that is determined beforehand when designing the device 100 as a code signal for determining the period of the internal clock OSCClk that is output by the oscillator circuit 23. Also, in the case where the calibration has failed, the state machine 20 outputs the failure signal CALIBFAIL which is the high level to the oscillator circuit 23 and the selection circuit 17. Further, the state machine 20 outputs a ready/busy signal RBn to the output buffer 22 to indicate that the device 100 can receive commands.

The control register 21 outputs signals that control the detailed operations of the programming, reading, and erasing of the data to the core unit 30 by the operation instruction signal being input from the state machine 20 and the block address BLKa, the string address STRa, the word line address WLa, and the column address COLa being input from the address buffer 14. These signals include a column address signal COLADD that is output to the cache/sense amplifiers 33 and a block address signal BLKADD, a string address signal STRADD, and a word line address signal WLADD that are output to the row decoder 32. The block address signal BLKADD is a signal to determine the block that is selected; the string address signal STRADD is a signal to determine the potential of the selection gate to select one of multiple strings Str included in the block of the memory cells; and the word line address signal WLADD is a signal to apply the select potential to the selected word line and the unselect potential to the unselected word line. Further, the column address signal COLADD is a signal to instruct the cache position when programming and reading. The control register 21 outputs multiple not-shown signals other than those recited above.

The output buffer 22 receives the ready/busy signal RBn from the state machine 20, generates the ready/busy signal RBnx, and outputs the ready/busy signal RBnx to the controller 200 via a signal pin.

The oscillator circuit 23 receives the various signals that determine the oscillation start signal and/or the oscillation period and outputs the internal clock OSCClk. The specific configuration and operations are described below.

The data read from the fuse region 37 of the cell array 31 is input via the cache/sense amplifiers 33 to the register circuit 24; and the register circuit 24 holds the data. The register circuit 24 outputs to the oscillator circuit 23 a code signal F_OSCdefault that determines the period of the internal clock OSCClk within the interval of the normal operation of the device 100. In the specification, the "normal operation" does not refer to the power-on read but refers to the operations such as the programming, reading, erasing, etc., of the data to and from the data storage region 36 of the cell array 31. Also, the register circuit 24 outputs a fail count reference value F_NF to the fail count counting circuit 25.

The fail count counting circuit 25 monitors the read-out data stored in the cache of the cache/sense amplifiers 33 and, at a prescribed timing, counts the number of bits or bytes that do not match the expected value, compares the number of bits or bytes to the fail count reference value F_NF that is input from the register circuit 24, and outputs the signal PASS that indicates the result to the state machine 20. For example, the fail count counting circuit 25 sets the signal PASS to the high level in the case where the number of bits or bytes that do not match the expected value is not more than the reference value and sets the signal PASS to the low level in the case where the number of bits or bytes that do not match the expected value exceeds the reference value.

The configuration of the oscillator circuit 23 will now be described.

Figure 3:
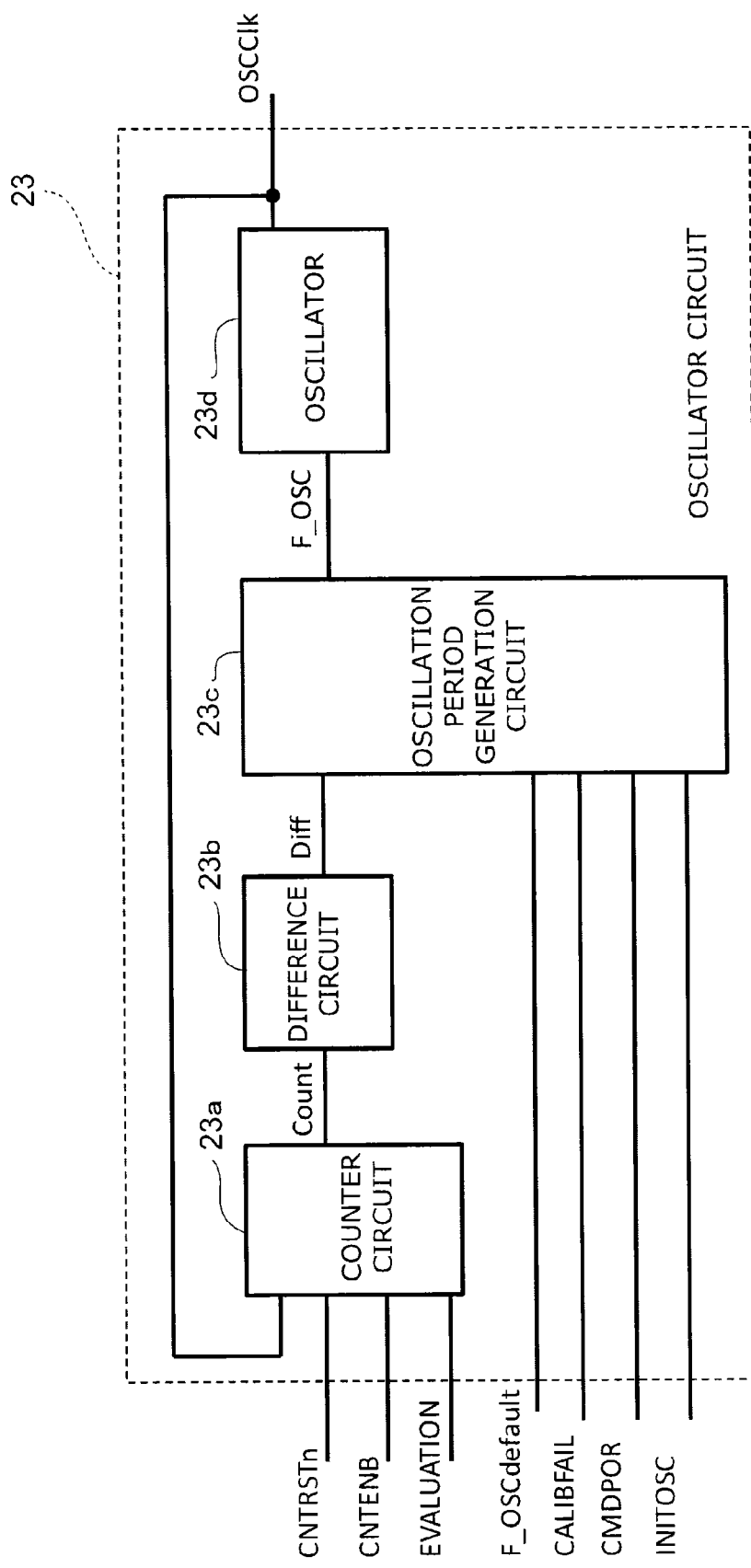
FIG. 3 is a block diagram showing an oscillator circuit shown in FIG. 2.

FIG. 3 is a block diagram showing the oscillator circuit shown in FIG. 2.

As shown in FIG. 3, the counter circuit 23a, a difference circuit 23b, an oscillation period generation circuit 23c, and an oscillator 23d are provided in the oscillator circuit 23.

A code signal F_OSC is input to the oscillator 23d; and the oscillator 23d is a circuit that generates the internal clock OSCClk for which the period is determined based on the code signal F_OSC. The configuration of the oscillator 23d is not particularly limited as long as the oscillation period can be changed according to the code signal F_OSC. In the embodiment, the period of the internal clock OSCClk is, for example, about 100 nanoseconds; and, for example, an RC circuit that includes a capacitor and a resistor can be used as the oscillator 23d because it is unnecessary for the microscopic accuracy of the period (the jitter) to be rigorous.

The internal clock OSCClk from the oscillator 23d is input to the counter circuit 23a; and the counter circuit 23a counts the number of periods of the internal clock OSCClk, e.g., the number of rises from the low level to the high level. The counter circuit 23a receives the inputs from the state machine 20 of the counter reset signal CNTRSTn that resets the count value of the counter circuit 23a to "0," the count enable signal CNTENB that causes the counter circuit 23a to start counting, and the count hold signal EVALUATION that causes the counter circuit 23a to stop counting and to hold and output a count value Count at that point in time.

The count value Count from the counter circuit 23*a* is input to the difference circuit 23*b*; and the difference circuit 23*b* calculates the difference between the count value Count and a reference value that is predetermined according to the reference time described below and outputs a difference value Diff.

The oscillation period generation circuit 23*c* receives the inputs of the difference value Diff from the difference circuit 23*b*, the code signal F_OSCdefault that determines the period of the internal clock OSCClk in the normal operation of the device 100 from the register circuit 24, the failure signal CALIBFAIL that indicates that the calibration of the internal clock OSCClk has failed and the fixed value signal INITOSC that indicates the fixed value Initial Value from the state machine 20, and the power-on read command CMDPOR that indicates the power-on read interval from the command decoder 15. The oscillation period generation circuit 23*c* generates the code signal F_OSC that determines the oscillation period of the oscillator 23*d* based on these signals and outputs the code signal F_OSC to the oscillator 23*d*.

A method for generating the code signal F_OSC by the oscillation period generation circuit 23*c* will now be described.

FIG. 4 is a drawing showing the relationship between the operating state of the nonvolatile memory device according to the embodiment, the signals input to the oscillation period generation circuit, and the code signal F_OSC that is output.

In FIG. 4, "L" represents the low level (inactive); "H" represents the high level (active); and "*" indicates that either L or H is acceptable.

As shown in FIG. 2 to FIG. 4, the power-on read command CMDPOR that indicates the power-on read interval is "L" when the device 100 performs the normal operations, i.e., the programming, reading, erasing, etc., of the data to and from the data storage region 36. In such a case, the code signal F_OSCdefault that is read from the fuse region 37 and held by the register circuit 24 is output as the code signal F_OSC. The oscillator 23*d* can generate the internal clock OSCClk to have the optimal period nearest the desired design value by using the code signal F_OSCdefault as the code signal F_OSC because the code signal F_OSCdefault is a value for which the shift of the period of the internal clock OSCClk caused by the fluctuation of the manufacturing conditions of the device 100, etc., are corrected.

Directly after the startup of the device 100, the code signal F_OSCdefault from the fuse region 37 has not been read; the calibration of the internal clock OSCClk has not been performed; the power-on read command CMDPOR is "H"; and the fixed value signal INITOSC also is "H". In such a case, the fixed value Initial Value is output as the code signal F_OSC. At this time, the oscillator 23*d* generates the internal clock OSCClk for which the period is determined based on the fixed value Initial Value. Then, the device 100 performs the calibration of the internal clock OSCClk described below using the oscillation period as an initial value.

Further, when the fuse data including the code signal F_OSCdefault is read from the fuse region 37 after performing the calibration of the internal clock OSCClk, the power-on read command CMDPOR becomes "H"; the fixed value signal INITOSC becomes "L"; and the failure signal CALIBFAIL becomes "L". In such a case, the oscillation period generation circuit 23*c* outputs, for example, a corrected value Trimmed Value which is the difference value Diff added to the fixed value Initial Value as the code signal F_OSC. At this time, the oscillator 23*d* generates the internal clock OSCClk for which the period is determined based on the corrected value Trimmed Value which is different from the fixed value Initial Value. Then, the device 100 reads the fuse data using the internal clock OSCClk.

Further, when the calibration of the internal clock OSCClk has failed, the power-on read command CMDPOR is "H; the fixed value signal INITOSC is "L"; and the failure signal CALIBFAIL that indicates that the calibration of the internal clock OSCClk has failed becomes "H. In such a case, a value that is different from both the fixed value Initial Value and the corrected value Trimmed Value is output as the code signal F_OSC. At this time, by giving more priority to safety than to the operation speed, the oscillator 23*d* outputs, for example, the internal clock OSCClk having the longest oscillation period that can be generated by the oscillator 23*d*. Thereby, even in the case where the period of the internal clock OSCClk based on the fixed value Initial Value is greatly shifted from the target value, the information from the fuse region 37 can be read reliably.

The configuration of the cell array 31 of the core unit 30 will now be described.

Figure 5:
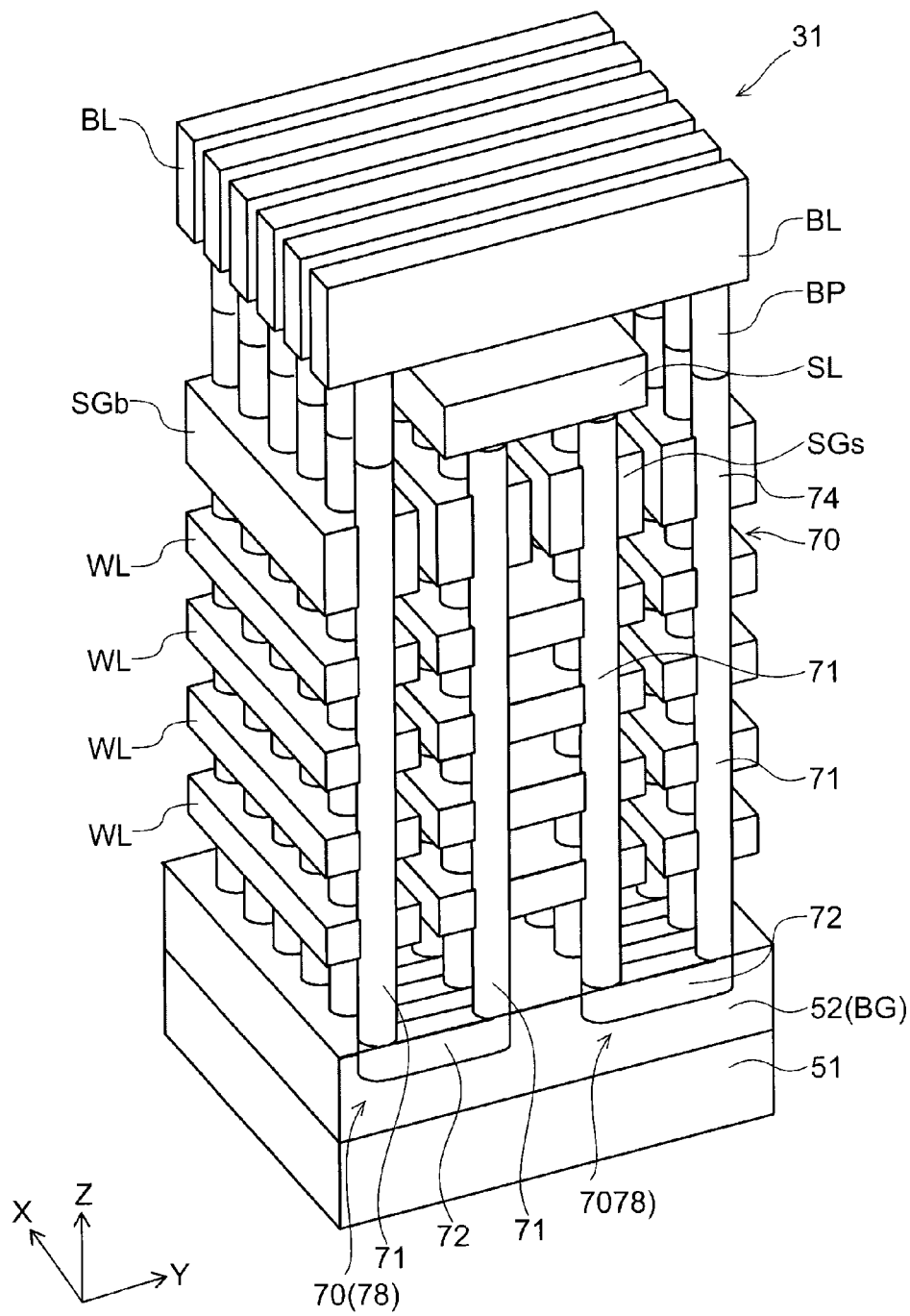
FIG. 5 is a perspective view showing a cell array of the first embodiment.

FIG. 5 is a perspective view showing the cell array of the embodiment.

Figure 6:
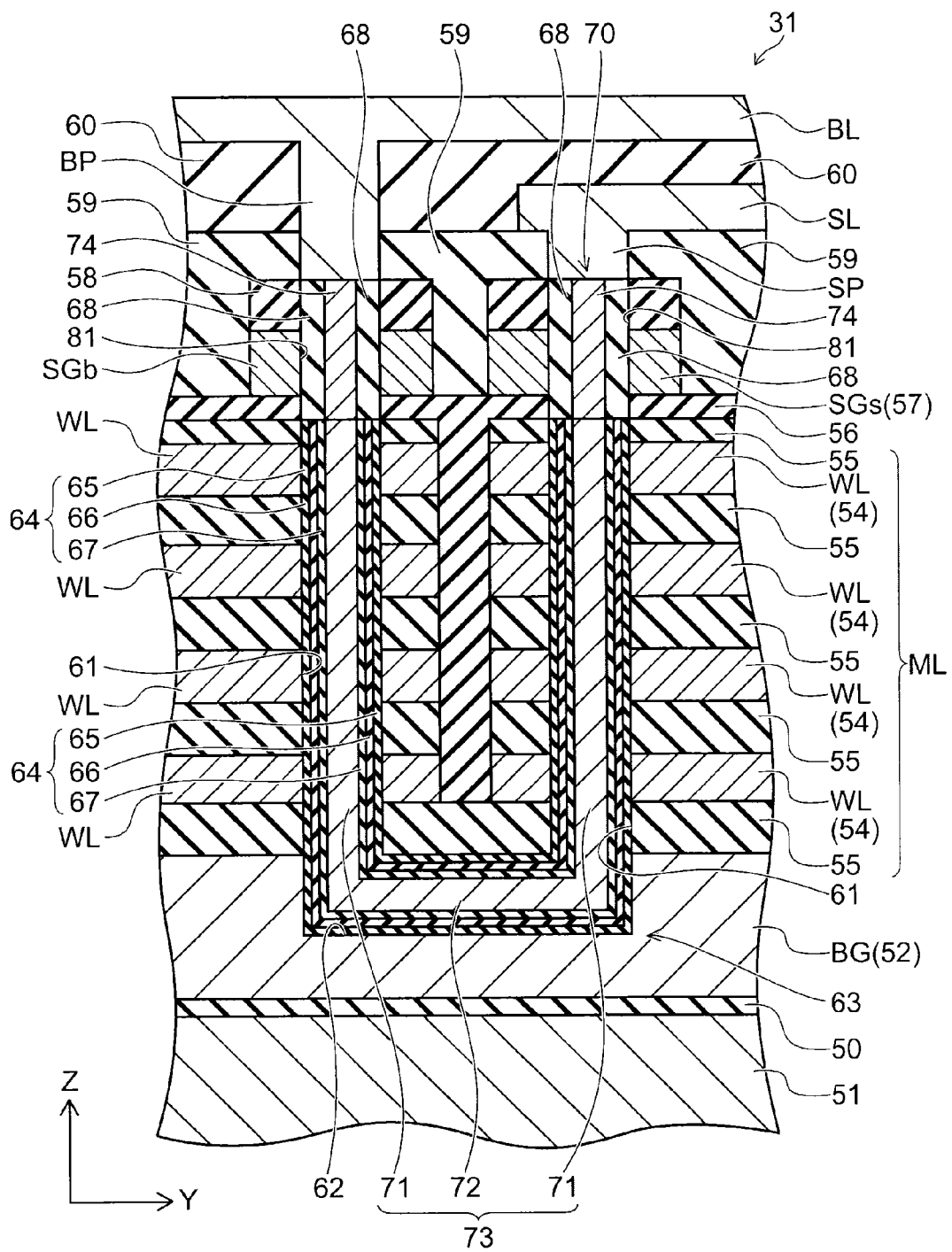
FIG. 6 is a cross-sectional view showing the cell array of the first embodiment.

FIG. 6 is a cross-sectional view showing the cell array of the embodiment.

Figure 7:
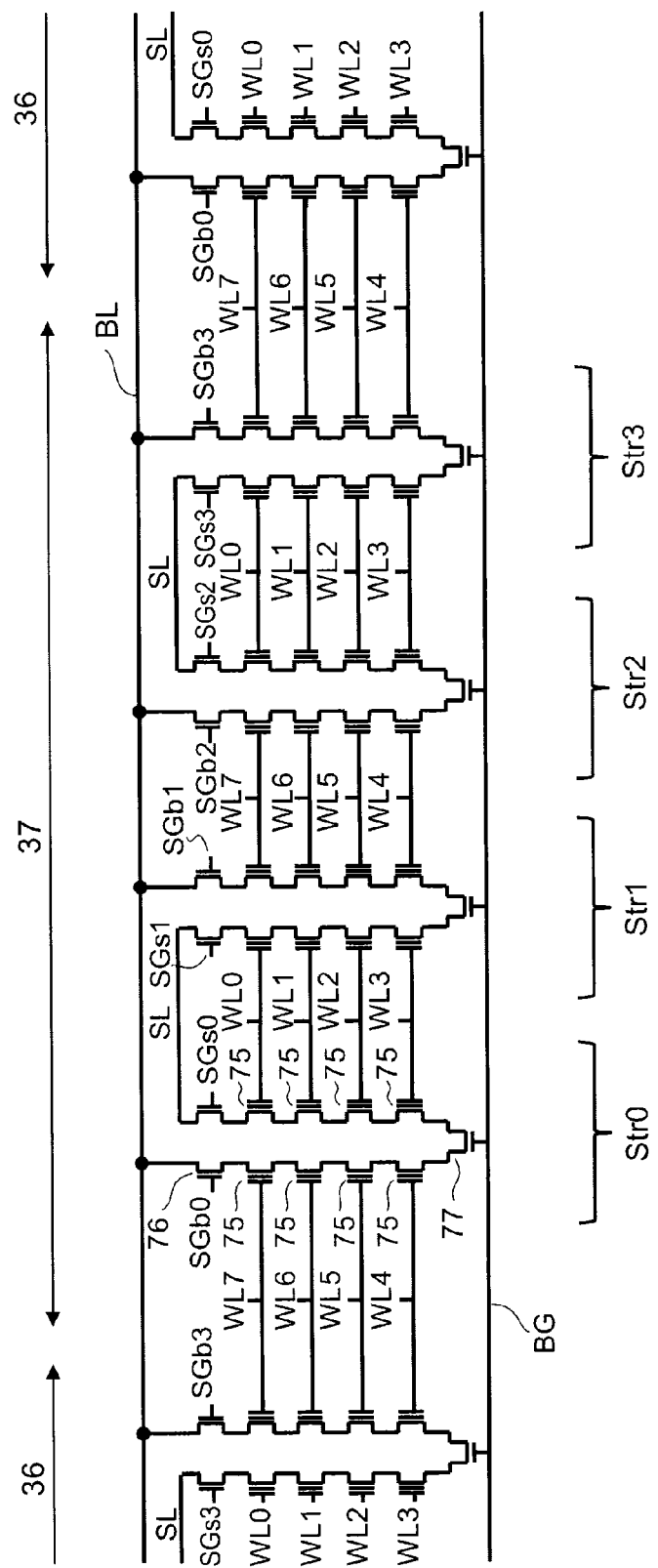
FIG. 7 is a circuit diagram showing the cell array of the first embodiment.

FIG. 7 is a circuit diagram showing the cell array of the embodiment.

In FIG. 5, only conductive portions are shown, and insulating portions are not shown for easier viewing of the drawing.

As shown in FIG. 5 to FIG. 7, a silicon substrate 51 is provided in the device 100. The core unit 30 and the peripheral circuit unit 10 are set in the silicon substrate 51. In the cell array 31 of the core unit 30, an insulating film 50 is provided on the silicon substrate 51; a conductive film, e.g., a polysilicon film 52, is formed on the insulating film 50; and the conductive film is used as a back gate BG. Multiple electrode films 54 are stacked alternately with multiple insulating films 55 on the back gate BG. Then, a stacked body ML includes the multiple electrode films 54 and the multiple insulating films 55.

Hereinbelow, an XYZ orthogonal coordinate system is introduced for convenience of description in FIG. 5 and FIG. 6. In the coordinate system, two mutually orthogonal directions that are parallel to the upper surface of the silicon substrate 51 are taken as an X direction and a Y direction; and a direction orthogonal to both the X direction and the Y direction, i.e., the stacking direction of the layers, is taken as a Z direction.

The electrode film 54 is formed of, for example, polysilicon. At the X-direction central portion of the stacked body ML, the electrode film 54 is divided along the Y direction and is used as multiple word lines WL extending in the X direction. When viewed from above, that is, from the Z direction, the electrode films 54 of each of the layers are patterned into the same pattern. The electrode film 54 is not divided along the Y direction at both of the X-direction end portions of the stacked body ML to form one pair of comb-shaped configurations. On the other hand, the insulating film 55 is made of, for example, silicon oxide ($SiO_2$) and functions as an interlayer insulating film that insulates between the electrode films 54.

An insulating film 56, a conductive film 57, and an insulating film 58 are formed in this order on the stacked body ML. The conductive film 57 is made of, for example, polysilicon and is divided along the Y direction to be used as multiple selection gate electrodes SG extending in the X direction. Two selection gate electrodes SG are provided in the region directly above the word line WL of the uppermost layer. In other words, the selection gate electrodes SG extend in the same direction (the X direction) as the word lines WL; but the arrangement period of the selection gate electrodes SG is half of that of the word lines WL. As described below, the selection gate electrodes SG include a selection gate electrode SGb on the bit line side and a selection gate electrode SGs on the source line side.

An insulating film 59 is provided on the insulating film 58; and source lines SL are provided on the insulating film 59 to extend in the X direction. The source lines SL are arranged in every other region directly above the word lines WL of the uppermost layer that are arranged along the Y direction. Further, an insulating film 60 is provided on the insulating film 59 to cover the source lines SL; and multiple bit lines BL are provided on the insulating film 60 to extend in the Y direction. The source lines SL and the bit lines BL are formed of metal films.

Then, multiple through-holes 61 that extend in the stacking direction (the Z direction) of the layers are made to pierce the stacked body ML. Each of the through-holes 61 pierces the word lines WL of each of the levels; and the lower end of each of the through-holes 61 reaches the back gate BG. Also, the through-holes 61 are arranged in a matrix configuration along the X direction and the Y direction. Then, the through-holes 61 arranged in the X direction pierce the same word lines WL because the word lines WL extend in the X direction. Also, the arrangement period of the through-holes 61 in the Y direction is half of the arrangement period of the word lines WL. Thereby, two of the through-holes 61 arranged in the Y direction form one set; and the through-holes 61 belonging to the same set pierce the same word lines WL.

A communicating hole 62 is made in the upper layer portion of the back gate BG such that the lower end portion of one through-hole 61 communicates with the lower end portion of one other through-hole 61 that is one column distal in the Y direction as viewed from the one through-hole 61. Thereby, one continuous U-shaped hole 63 is made of one pair of through-holes 61 that is adjacent to each other in the Y direction and the communicating hole 62 communicating between the pair. Multiple U-shaped holes 63 are made in the stacked body ML.

An ONO film (Oxide Nitride Oxide film) 64 is provided on the inner surface of the U-shaped hole 63. A blocking layer 65 that is insulative, a charge storage layer 66, and a tunneling layer 67 that is insulative are stacked in the ONO film 64 in order from the outside. The blocking layer 65 is in contact with the back gate BG, the word lines WL, and the insulating films 55. The blocking layer 65 and the tunneling layer 67 are made of, for example, silicon oxide; and the charge storage layer 66 is made of, for example, silicon nitride. The blocking layer 65 is a layer in which a current substantially does not flow even when a voltage within the range of the drive voltage of the device 100 is applied. The charge storage layer 66 is a layer capable of storing charge and is, for example, a layer including trap sites of electrons. Although the tunneling layer 67 normally is insulative, the tunneling layer 67 is a layer that allows a tunneling current to flow when a prescribed voltage within the range of the drive voltage of the device 100 is applied.

Also, a semiconductor material, e.g., polysilicon, that is doped with an impurity is filled into the interior of the U-shaped hole 63. Thereby, a U-shaped silicon member 73 is provided in the interior of the U-shaped hole 63. The portion of the U-shaped silicon member 73 positioned inside the through-holes 61 forms silicon pillars 71; and the portion of the U-shaped silicon member 73 positioned inside the communicating hole 62 forms a connection member 72. The silicon pillar 71 has a columnar configuration, e.g., a circular columnar configuration, extending in the Z direction. The configuration of the connection member 72 has a columnar configuration, e.g., a quadrilateral columnar configuration, extending in the Y direction. The two silicon pillars 71 and the one connection member 72 included in the U-shaped silicon member 73 are formed integrally; and accordingly, the U-shaped silicon member 73 is formed continuously without a break along the longitudinal direction of the U-shaped silicon member 73. Further, the U-shaped silicon member 73 is insulated from the back gate BG and the word lines WL by the ONO film 64.

Multiple through-holes 81 are made in the insulating film 56, the selection gate electrode SG, and the insulating film 58. The through-holes 81 are made in the regions directly above the through-holes 61 to communicate with the through-holes 61. Here, because the selection gate electrodes SG extend in the X direction, the through-holes 81 that are arranged in the X direction pierce the same selection gate electrode SG. Also, the arrangement period of the through-holes 81 in the Y direction is the same as the arrangement period of the selection gate electrodes SG with the same arrangement phase. Accordingly, the multiple through-holes 81 that are arranged in the Y direction have a one-to-one correspondence with the selection gate electrodes SG and pierce mutually-different selection gate electrodes SG.

A gate insulating film 68 is formed on the inner surface of the through-hole 81. Also, for example, polysilicon is filled into the interior of the through-hole 81 to form a silicon pillar 74. The silicon pillar 74 has a columnar configuration, e.g., a circular columnar configuration, extending in the Z direction. The lower end portion of the silicon pillar 74 is connected to the upper end portion of the silicon pillar 71 that is formed in the region directly under the silicon pillar 74. Further, the silicon pillar 74 is insulated from the control gate electrode SG by the gate insulating film 68. Then, a U-shaped pillar 70 includes the U-shaped silicon member 73 and one pair of silicon pillars 74 connected to the upper end portions of the U-shaped silicon member 73.

The positional relationship between the U-shaped pillars 70, the word lines WL, the selection gate electrodes SG, the source lines SL, and the bit lines BL will now be described.

A pair of the silicon pillars 74 and 71 that is adjacent to each other in the Y direction is connected to each other by the connection member 72 to form the U-shaped pillar 70. On the other hand, the word lines WL, the selection gate electrodes SG, and the source lines SL extend in the X direction; and the bit lines BL extend in the Y direction. Although the arrangement periods of the U-shaped pillars 70 and the word lines WL in the Y direction are the same, the phases are shifted one-half period; and therefore, the pair of silicon pillars 71 belonging to each of the U-shaped pillars 70, i.e., the two silicon pillars 71 connected to each other by the connection member 72, pierce mutually-different word lines WL. On the other hand, the two silicon pillars 71 that are adjacent to each other and belong to two U-shaped pillars 70 that are adjacent to each other in the Y direction pierce common word lines WL.

Also, because the multiple silicon pillars 74 arranged in the Y direction pierce mutually-different selection gates SG, the pair of silicon pillars 74 belonging to each of the U-shaped pillars 70 also pierces mutually-different selection gate electrodes SG. On the other hand, the multiple U-shaped pillars 70 arranged in the X direction pierce one common pair of selection gates SG.

Further, one silicon pillar 74 of the pair of silicon pillars 74 belonging to each of the U-shaped pillars 70 is connected to the source line SL via a source plug SP buried inside the insulating film 59; and the other silicon pillar 74 is connected to the bit line BL via a bit plug BP buried inside the insulating films 59 and 60. Accordingly, the U-shaped pillar 70 is connected between the bit line BL and the source line SL. In FIG. 5 to FIG. 7, the selection gate electrode SG that is disposed on the bit line side of the selection gate electrodes SG pierced by the U-shaped pillar 70 is labeled as the selection gate electrode SGb; and the selection gate electrode SG that is disposed on the source line side is labeled as the selection gate electrode SGs. The U-shaped pillars 70 that are arranged in the X direction are connected to a common source line and are connected to mutually-different bit lines BL. Here, because the arrangement period of the U-shaped pillars 70 in the X direction is the same as the arrangement period of the bit lines BL, the U-shaped pillars 70 and the bit lines BL have a one-to-one correspondence in the X direction. On the other hand, one set of two of the U-shaped pillars 70 that are arranged in the Y direction is connected to each of the source lines SL and is connected to a common bit line BL.

In the cell array 31 as shown in FIG. 5 to FIG. 7, the silicon pillars 71 function as channels; the word lines WL function as gate electrodes; and thereby, vertical memory cell transistors 75 are formed at the intersections between the silicon pillars 71 and the word lines WL. Each of the memory cell transistors 75 functions as a memory cell by storing electrons in the charge storage layer 66 that is disposed between the silicon pillar 71 and the word line WL. Because the multiple silicon pillars 71 are arranged in a matrix configuration along the X direction and the Y direction inside the stacked body ML, the multiple memory cell transistors 75 are arranged three-dimensionally along the X direction, the Y direction, and the Z direction.

Also, a selection transistor 76 in which the silicon pillar 74 is used as the channel, the selection gate electrode SG is used as the gate electrode, and the gate insulating film 68 is used as the gate insulating film is formed at the intersection between the silicon pillar 74 and the selection gate electrode SG. Similarly to the memory cell transistor 75 described above, the selection transistor 76 is a vertical transistor.

Because the ONO film 64 is interposed between the connection member 72 and the back gate BG, a back gate transistor 77 is formed in which the connection member 72 is used as the channel, the back gate BG is used as the gate electrode, and the ONO film 64 is used as the gate insulating film. In other words, the back gate BG functions as an electrode that controls the conducting state of connection member 72 by an electric field.

As a result, as shown in FIG. 7, the memory string Str is connected from the bit line BL to the source line SL along each of the U-shaped pillars 70. In each of the memory strings Str, the selection transistors 76 are provided at the two end portions; the back gate transistor 77 is provided at the central portion; and the same number of memory cell transistors 75 as the number of stacks of the electrode films 54 are connected in series between the back gate transistor 77 and each of the selection transistors 76. In other words, the multiple memory cell transistors 75 arranged three-dimensionally inside the stacked body ML may be collected as the memory string Str for each of the U-shaped silicon members 73. A memory string line includes the multiple memory strings Str that are arranged along the X direction to share one pair of selection gate electrodes SGb and SGs. Then, in the cell array 31, the fuse region 37 includes, for example, four memory string lines that are consecutively arranged along the Y direction.

In FIG. 7, for convenience of description of the third embodiment described below, the memory strings included in the fuse region 37 are differentiated by marking with the reference numerals of Str0 to Str3; the selection gate electrodes are differentiated by marking with the reference numerals of SGb0 to SGb3 and SGs0 to SGs3; and the word lines are differentiated by marking with the reference numerals of the word lines WL0 to WL7.

Operations of the nonvolatile memory device according to the embodiment will now be described.

First, the normal operation of the nonvolatile memory device 100 will be described.

As described above, the "normal operation" is the original operation of the memory device such as the programming, reading, erasing, etc., of the data to and from the data storage region 36 and is the operation after the power-on read interval has ended.

In the normal operation as shown in FIG. 2 and FIG. 3, the fuse data that is stored in the fuse region 37 of the cell array 31 is read via the cache/sense amplifiers 33. Other than the defective bit information, the period correction information of the internal clock OSCClk is included in the fuse data. The period correction information of the internal clock OSCClk is information that determines the value of the code signal F_OSC such that the period of the internal clock OSCClk becomes the optimal value nearest the desired design value. For example, the period correction information is determined in the factory shipment test process of the device 100 and is programmed to the fuse region 37. Therefore, the period correction information may be different for each device 100. The period correction information of the internal clock OSCClk is held by the register circuit 24 and is output to the oscillation period generation circuit 23c of the oscillator circuit 23 as the code signal F_OSCdefault. Also, the power-on read command CMDPOR that is input to the oscillation period generation circuit 23c of the oscillator circuit 23 from the command decoder 15 is the low level (L). Thereby, as shown in FIG. 4, the oscillation period generation circuit 23c outputs the code signal F_OSCdefault to the oscillator 23d.

The oscillator 23d corrects the period of the internal clock OSCClk based on the code signal F_OSCdefault. For example, in the case where an RC circuit is used as the oscillator 23d, a capacitor C and a resistor R of the RC circuit unavoidably fluctuate undesirably within a constant control range due to fluctuation of the manufacturing conditions, etc., in the manufacturing processes of the device 100. Therefore, if the correction is not performed, the oscillation period of the oscillator 23d undesirably fluctuates between the devices 100. Therefore, to suppress the fluctuation, the oscillation period is caused to approach the desired value by adjusting at least one selected from the capacitor C and the resistor R. For example, in the case where the capacitor C is realized by connecting multiple capacitors provided inside the oscillator 23d in parallel, the value of the capacitor C is controlled by adjusting the number of the capacitors connected in parallel. Further, in the case where the resistor R is realized by connecting multiple resistance members provided inside the oscillator 23d in series, the value of the resistor R is controlled by adjusting the number of the resistance members connected in series. Thereby, the oscillator 23d outputs the internal clock OSCClk that is corrected to be the desired oscillation period to the synchronization circuit 19 and the state machine 20.

Based on the internal clock OSCClk that is corrected, the state machine 20 performs the operations such as the programming, reading, erasing, etc., of the data to and from the data storage region 36 of the cell array 31. At this time, as shown in FIG. 2, FIG. 5, and FIG. 7, one memory string Str is selected by the row decoder 32 by selecting one pair of selection gate electrodes SGb and SGs based on the string address signal STRADD. Also, the programming and reading of the data to and from a designated memory cell belonging to the memory string Str is performed by the row decoder 32, based on the word line address signal WLADD, by applying the select potential to the word line WL that is selected and applying the unselect potential to the word lines WL that are unselected.

The power-on read of the nonvolatile memory device 100 will now be described.

As described above, the normal operation of the device 100 uses the period correction information stored in the fuse region 37. Therefore, although it is necessary to read the period correction information from the fuse region 37 by implementing the power-on read in the startup of the device 100, the period correction information has not yet been read and cannot be used in the power-on read operation. Therefore, in the embodiment, the period of the internal clock OSCClk is corrected inside the peripheral circuit unit 10 by an autonomous and easy method.

First, a summary of the power-on read will be described.

Figure 8:
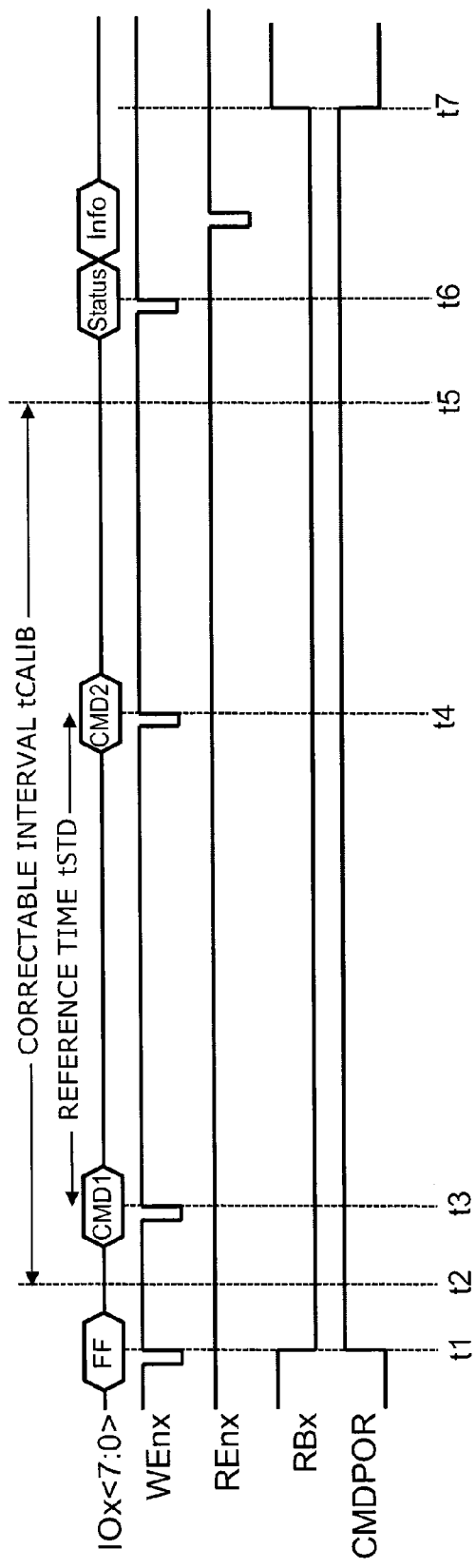
FIG. 8 is a timing chart showing a summary of a power-on read of the first embodiment, where the horizontal axis is time, and the vertical axis is the values of the signals.

FIG. 8 is a timing chart showing the summary of the power-on read of the embodiment, where the horizontal axis is time, and the vertical axis is the values of the signals.

When performing the power-on read as shown in FIG. 1 and FIG. 8, the controller 200 sets the write enable signal WEnx, which is an active-low signal, to the low level (active) for the nonvolatile memory device 100 and synchronously inputs a start command FF that starts the power-on read to the nonvolatile memory device 100 via the bidirectional bus IOx<7:0>. This time is taken as a time t1. Thereby, the device 100 starts the power-on read by setting the power-on read command CMDPOR to the high level; and the ready/busy signal RBnx is set to the low level to communicate to the controller 200 that the device 100 is in the busy state and cannot receive commands other than the commands necessary for the power-on read.

First, the device 100 implements the calibration. The device 100 defines a certain time on the data sheet as an interval in which the commands CMD1 and CMD2 can be input. The interval is taken as a correctable interval tCALIB of the internal clock OSCClk. The correctable interval tCALIB is, for example, 10 microseconds. The progression of the correctable interval tCALIB is started at time t2. The interval between time t1 and time t2 is, for example, 1 microsecond.

At time t3 which is after ensuring a sufficient margin after time t2, the controller 200 sets the write enable signal WEnx to the low level for the device 100 and synchronously inputs the command CMD1 to the device 100 via the bidirectional bus IOx<7:0>. Subsequently, at time t4, the controller 200 sets the write enable signal WEnx to the low level for the device 100 and synchronously inputs the command CMD2 to the device 100 via the bidirectional bus IOx<7:0>. The device 100 defines the reference time tSTD as the interval from when the command CMD1 is input to when the command CMD2 is input. The reference time tSTD is, for example, 1.6 microseconds. The device 100 performs the calibration of the period of the internal clock OSCClk using the reference time tSTD as a reference. The specific method of the calibration is described below.

Subsequently, the correctable interval tCALIB ends at time t5. Then, at time t6, the controller 200 sets the write enable signal WEnx to the low level for the device 100 and synchronously inputs a command Status to the device 100 via the bidirectional bus IOx<7:0> to inquire whether or not the calibration succeeded. The device 100 responds by setting the read enable signal REnx, which is an active-low signal, to the low level (active) for the controller 200 and outputting information Info to the controller 200 via the bidirectional bus IOx<7:0> to indicate whether or not the calibration succeeded. The input of the command Status is arbitrary and may not be input.

On the other hand, the device 100 reads the fuse data in the interval from time t5 to time t7. Subsequently, at time t7, the device 100 returns the power-on read command CMDPOR to the low level and ends the power-on read. At this time, the device 100 returns the ready/busy signal RBnx to the high level to communicate to the controller 200 that the device 100 can receive the commands of the normal operation.

Summarizing the description recited above, the four following commands relating to the power-on read are input from the controller 200 to the device 100. However, the input of the command Status of (4) recited below is arbitrary.

(1) The start command FF (time t1) that starts the power-on read (2) The command CMD1 (time t3) that indicates the start of the reference time tSTD (3) The command CMD2 (time t4) that indicates the end of the reference time tSTD (4) The command Status (time t6) that inquires whether or not the calibration succeeded On the other hand, the following one type of information is output from the device 100 to the controller 200.

(1) The information Info (the time after time t6 at which the command Status is input) that indicates whether or not the calibration succeeded However, the information Info is output from the controller 200 only in the case where the command Status is input.

The details of the power-on read, and in particular, the details of the calibration, will now be described with the internal operations of the device 100.

Figure 9:
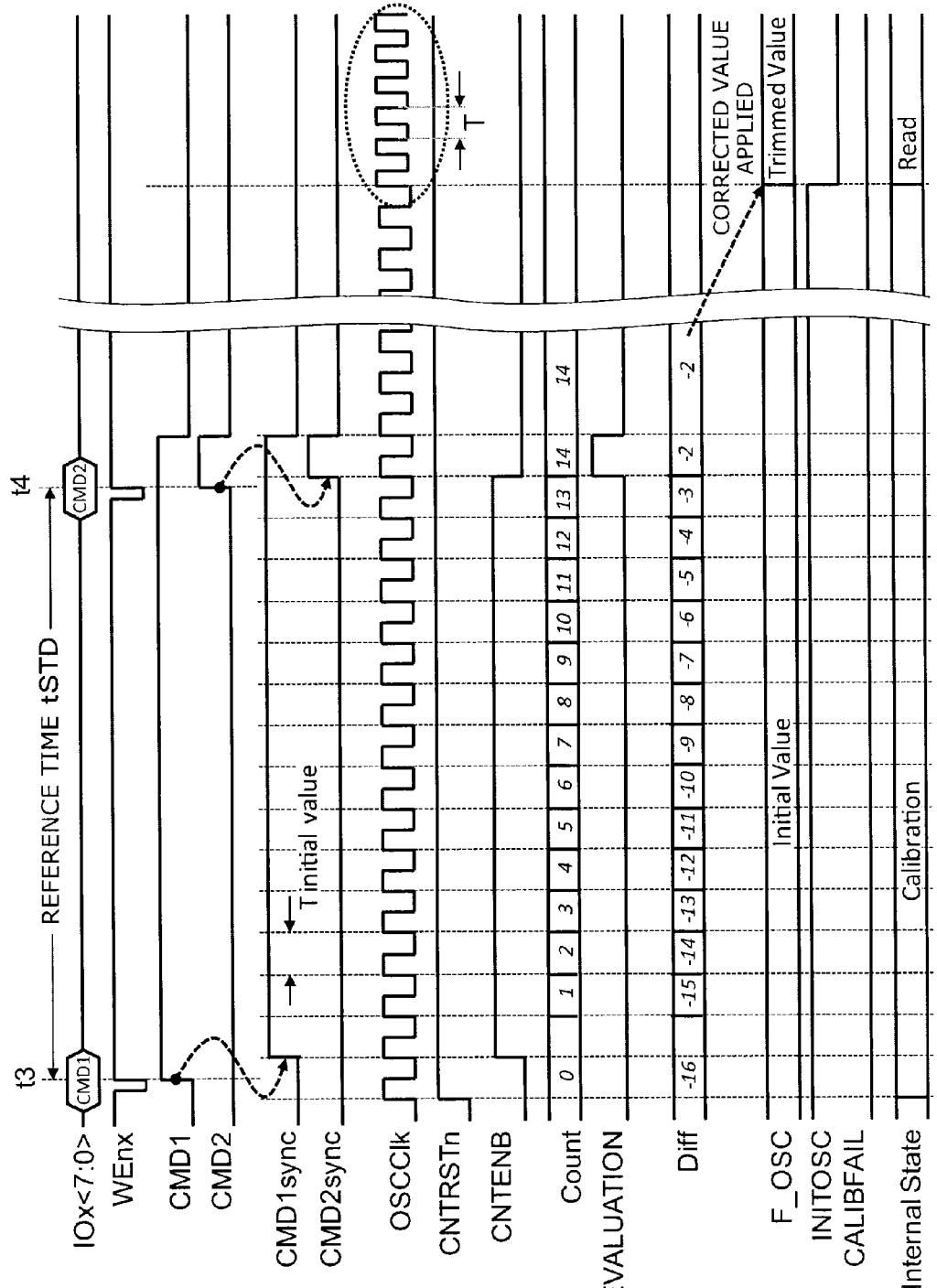
FIG. 9 is a timing chart showing in detail the power-on read method of the first embodiment to show the case where an internal clock OSCClk is slower than the target, where the horizontal axis is time, and the vertical axis is the values of the signals.

FIG. 9 is a timing chart showing in detail the power-on read method of the embodiment to show the case where the internal clock OSCClk is slower than the target, where the horizontal axis is time, and the vertical axis is the values of the signals.

Figure 10:
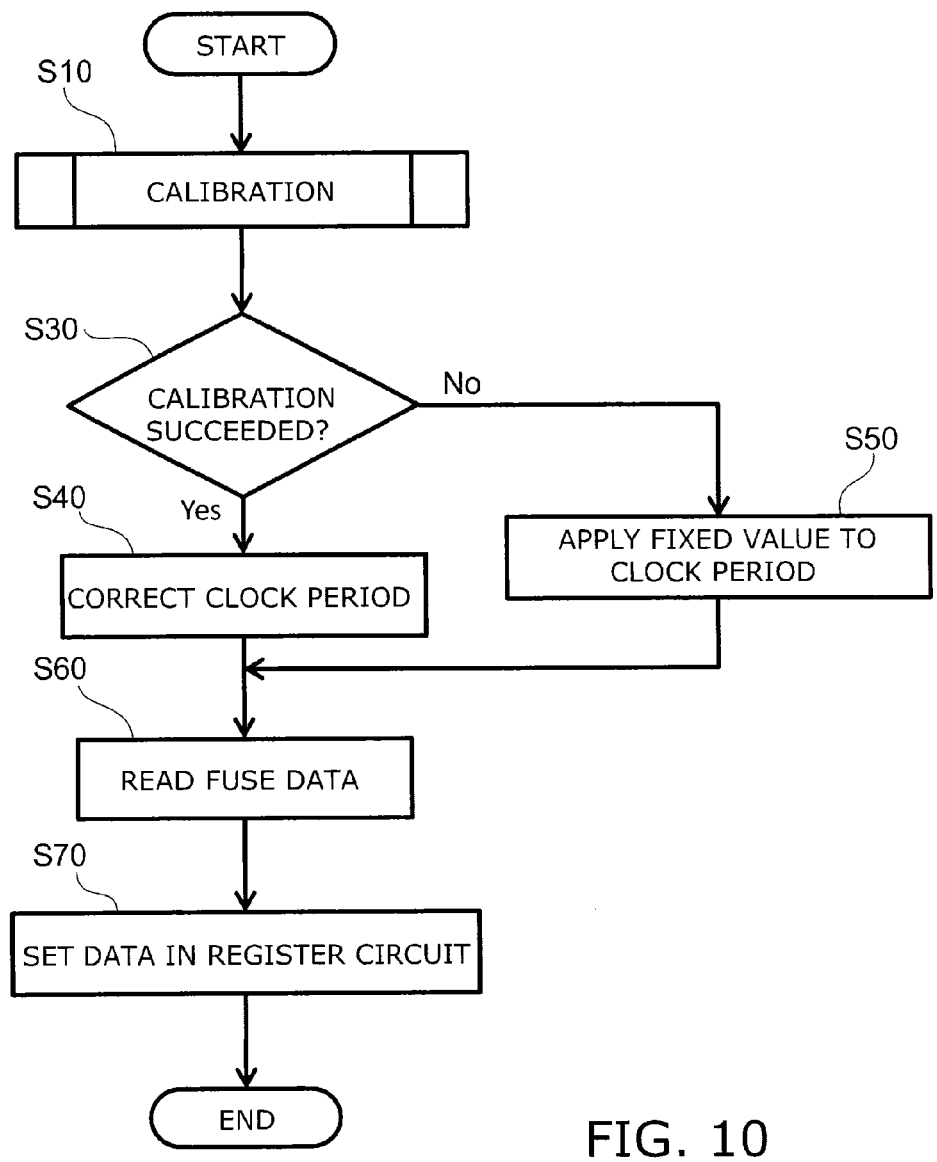
FIG. 10 is a flowchart showing the operation of the state machine of the power-on read of the first embodiment.

FIG. 10 is a flowchart showing the operation of the state machine of the power-on read of the embodiment.

Figure 11:
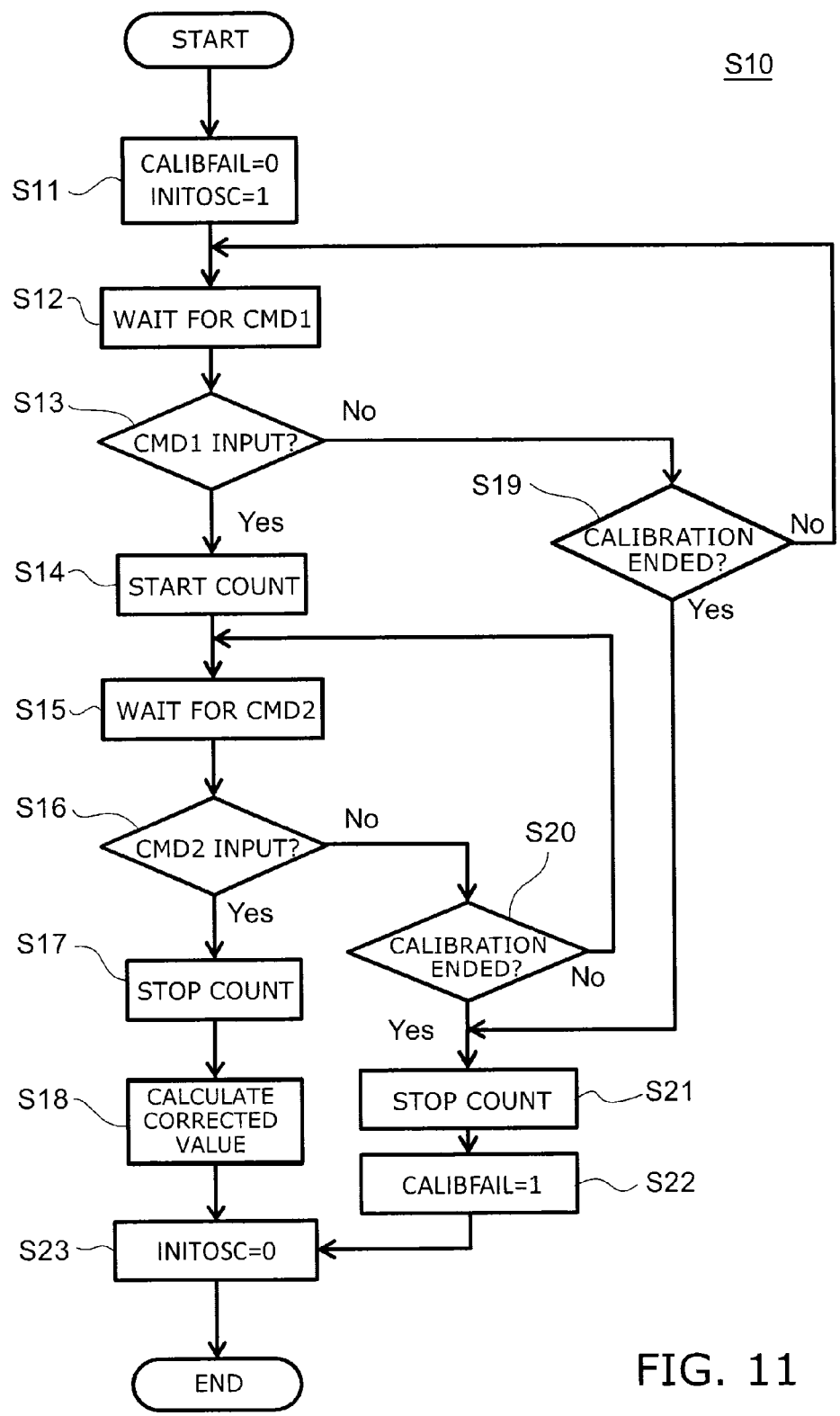
FIG. 11 is a flowchart showing the subroutine S10 shown in FIG. 10.

FIG. 11 is a flowchart showing the subroutine S10 shown in FIG. 10.

The following description refers to FIG. 1 to FIG. 4 and FIG. 8 to FIG. 11.

As shown in FIG. 2 and FIG. 8, when the start command FF that starts the power-on read is input to the input buffer 11 and the input buffer 12 of the nonvolatile memory device 100 at time t1, the command decoder 15 sets the power-on read command CMDPOR to the high level and transmits the power-on read command CMDPOR to the synchronization circuit 19 and the oscillator circuit 23. The synchronization circuit 19 generates the synchronous signal CMDPORsync by synchronizing the power-on read command CMDPOR with the internal clock OSCClk and outputs the synchronous signal CMDPORsync to the state machine 20.

Thereby, the state machine 20 starts up and starts the power-on read. The state machine 20 sets the ready/busy signal RBn to the low level. The ready/busy signal RBn of the low level is converted into the ready/busy signal RBnx by the output buffer 22 and transmitted to the controller 200 via the signal pin. Thereby, it is communicated to the controller 200 that the device 100 is in the busy state and cannot receive commands other than the commands necessary for the power-on read.

Then, as shown in step S10 of FIG. 10, the state machine 20 starts the calibration. At time t2 as shown in FIG. 8, the state machine 20 sets the correctable interval tCALIB as the interval within which the commands CMD1 and CMD2 can be input. Also, the state machine 20 sets the counter reset signal CNTRSTn, which is an active-low signal, to be inactive (the high level) to release the initial reset of the counter circuit 23a. At this time, the count value Count of the counter circuit 23a is "0".

Then, as shown in step S11 of FIG. 11, the state machine 20 sets the failure signal CALIBFAIL to the low level (0) and sets the fixed value signal INITOSC to the high level (1). These signals are transmitted to the oscillator circuit 23. Thereby, the device 100 is initialized to a state in which the calibration is possible.

At this time, as shown in FIG. 3 and FIG. 4, the code signal F_OSC that is output from the oscillation period generation circuit 23c of the oscillator circuit 23 to the oscillator 23d becomes the fixed value Initial Value because the power-on read command CMDPOR is switched to the high level (H) and the fixed value signal INITOSC is switched to the high level (H). Thereby, the oscillator 23d outputs the internal clock OSCClk having an oscillation period that is fixed based on the fixed value Initial Value. The oscillation period at this time fluctuates between the devices 100 due to the fluctuation of the manufacturing conditions of the device 100, etc.

Then, the state machine 20 waits for the input of the command CMD1 as shown in step S12 of FIG. 11, confirms the input/non-input of the command CMD1 as shown in step S13, proceeds to step S19 if the command CMD1 is not input, confirms whether or not the correctable interval tCALIB has ended, and returns to step S12 by determining that the calibration has not ended if the correctable interval tCALIB has not elapsed. Thereafter, the flow circles around the loop of step S12→step S13→step S19→step S12 until the command CMD1 is input or the correctable interval tCALIB ends.

At time t3, when the command CMD1 is input to the input buffer 12 synchronously with the transition to the low level of the write enable signal WEnx that is input to the input buffer 11, the command decoder 15 outputs the command CMD1 to the synchronization circuit 19. As shown in FIG. 9, the synchronization circuit 19 causes the synchronous signal CMD1sync to rise from the low level to the high level at the timing at which the internal clock OSCClk first rises from the low level to the high level after the command CMD1 is input. Thus, the synchronization circuit 19 generates the synchronous signal CMD1sync in which the command CMD1 is synchronized with the internal clock OSCClk. The synchronous signal CMD1sync is input to the state machine 20.

When the synchronous signal CMD1sync is switched to the high level, the state machine 20 determines that the command CMD1 has been input, proceeds from step S13 to step S14 shown in FIG. 11, and switches the count enable signal CNTENB from the low level to the high level. Thereby, the counter circuit 23a of the oscillator circuit 23 is caused to start counting the clock edge where the internal clock OSCClk rises from the low level to the high level. After the synchronous signal CMD1sync has switched to the high level, the counter circuit 23a starts counting from the first rise of the internal clock OSCClk and increases the count value Count one at a time from "0". Thus, the counter circuit 23a generates the count value Count by counting the number of periods of the internal clock OSCClk and outputs the count value Count to the difference circuit 23b.

The reference value that is predetermined according to the reference time tSTD is held in the difference circuit 23b. For example, in the embodiment, because the reference time tSTD is 1.6 microseconds and the target value of the period of the internal clock OSCClk is set to 100 nanoseconds (0.1 microseconds), the reference value is set to "16" (=1.6 microseconds/0.1 microseconds). The difference circuit 23b calculates the difference value Diff which is the reference value subtracted from the count value Count. The difference value Diff is input to the oscillation period generation circuit 23c. At this time, because the difference value Diff equals the count value Count minus reference value (16), the difference value Diff becomes "−16" if the count value Count is "0"; the difference value Diff becomes "−15" if the count value Count is "1"; and the difference value Diff becomes "0" if the count value Count is "16". Thus, the difference value Diff increases one at a time synchronously with the count value Count.

Then, the state machine 20 waits for the input of the command CMD2 as shown in step S15 of FIG. 11, confirms the input/non-input of the command CMD2 as shown in step S16, proceeds to step S20 if the command CMD2 is not input, confirms whether or not the correctable interval tCALIB has ended, and returns to step S15 by determining that the calibration has not ended if the correctable interval tCALIB has not ended. Thereafter, the flow circles around the loop of step S15→step S16→step S20→step S15 until the command CMD2 is input or the correctable interval tCALIB ends.

At time t4, when the command CMD2 is input to the input buffer 12 synchronously with the transition to the low level of the write enable signal WEnx that is input to the input buffer 11, the command decoder 15 outputs the command CMD2 to the synchronization circuit 19. After the command CMD2 is input, the synchronization circuit 19 causes the synchronous signal CMD2sync to rise from the low level to the high level at the timing at which the internal clock OSCClk first rises from the low level to the high level. Thus, the synchronization circuit 19 generates the synchronous signal CMD2sync in which the command CMD2 is synchronized with the internal clock OSCClk. The synchronous signal CMD2sync is input to the state machine 20.

When the synchronous signal CMD2sync is switched to the high level, the state machine 20 proceeds from step S16 to step S17 of FIG. 11 and causes the counter circuit 23a to stop counting. Specifically, the state machine 20 switches the count enable signal CNTENB from the high level to the low level and switches the count hold signal EVALUATION from the low level to the high level. Thereby, the counter circuit 23a stops counting and holds the count value Count at this time. As a result, the value of the difference value Diff that is output by the difference circuit 23b also is fixed. As shown in FIG. 9, the count value Count that is ultimately held is the number of periods of the internal clock OSCClk within the reference time tSTD.

In the example shown in FIG. 9, because the internal clock OSCClk is too slow, that is the period of the internal clock OSCClk is longer than the target value, e.g., 100 nanoseconds, the count value Count does not reach "16"; and the count value Count that is ultimately reached and held is "14". In other words, the period of the internal clock OSCClk within the reference time tSTD should be counted 16 times if the period of the internal clock OSCClk is appropriate, but was only counted 14 times. Therefore, the difference value Diff is held at "−2". Subsequently, when the synchronous signal CDM2sync transitions to the high level, the commands CDM1 and CDM2, the synchronous signals CDM1sync and CDM2sync, and the count hold signal EVALUATION all are switched to the low level at the next rise of the internal clock OSCClk.

Then, as shown in step S18 of FIG. 11, the oscillation period generation circuit 23c of the oscillator circuit 23 calculates the corrected value of the period of the internal clock OSCClk. The corrected value is determined such that the period of the internal clock OSCClk approaches the design center value. The method for calculating the corrected value is described below. Then, as shown in step S23, the state machine 20 sets the fixed value signal INITOSC to the low level (0). Thereby, the subroutine S10 ends.

Continuing as shown in step S30 of FIG. 10, the state machine 20 determines whether or not the calibration succeeded. The determination is performed based on the value of the failure signal CALIBFAIL. In the example shown in FIG. 9, the state machine 20 determines that the calibration succeeded because the value of the failure signal CALIBFAIL keeps the low level (0) in step S11 of FIG. 11.

In this case, the flow proceeds to step S40; and the corrected value calculated in step S18 of FIG. 11 is applied to the period of the internal clock OSCClk. In other words, as shown in FIG. 3 and FIG. 4, the value of the code signal F_OSC that the oscillation period generation circuit 23c outputs to the oscillator 23d becomes the corrected value Trimmed Value that is determined by the fixed value Initial Value and the difference value Diff because the power-on read command CMDPOR remains at the high level (H), the fixed value signal INITOSC is switched to the low level (L) in step S23, and the failure signal CALIBFAIL is the low level (L). As a result, as shown in FIG. 9, the period of the internal clock OSCClk is modified based on the corrected value Trimmed Value. In the example shown in FIG. 9, because the previous internal clock OSCClk based on the fixed value Initial Value was too slow, the internal clock OSCClk is corrected to a faster internal clock OSCClk based on the corrected value Trimmed Value.

On the other hand, as shown in FIG. 8, at time t6 after the correctable interval tCALIB has elapsed to reach time t5, there are cases where the command Status that inquires whether or not the calibration succeeded is input from the controller 200 to the device 100. In such a case, the state machine 20 outputs the failure signal CALIBFAIL to the bidirectional bus IOx<7:0> via the selection circuit 17 and the output buffer 13 according to the command Status. Thereby, the information Info that indicates whether or not the calibration succeeded is output from the device 100 to the controller 200.

Then, as shown in step S60 of FIG. 10, the fuse data stored in the fuse region 37 is read via the cache/sense amplifiers 33 using the internal clock OSCClk for which the oscillation period is corrected based on the corrected value Trimmed Value. The reading of data other than the fuse data also is performed using the internal clock OSCClk that is corrected. Then, as shown in step S70 of FIG. 10, the period correction information included in the fuse data that is read is set as the hold value of the register circuit 24.

Then, at time t7 as shown in FIG. 8, the state machine 20 switches the power-on read command CMDPOR from the high level to the low level. Thereby, as shown in FIG. 4, the value of the code signal F_OSC becomes the code signal F_OSCdefault. As a result, in the device 100, the normal operation using the period correction information that is held by the register circuit 24 is possible. Also, the state machine 20 causes the ready/busy signal RBn to transition to the high level to communicate to the controller 200 that the device 100 can receive the commands of the normal operation. Thereby, the power-on read ends.

In the description recited above, the case is described where the internal clock OSCClk that is unique to the device 100 is slower than the target, that is, the oscillation period is longer than the target value.

The case will now be described where the internal clock OSCClk that is unique to the device 100 is faster than the target, that is, the oscillation period is shorter than the target value.

Figure 12:
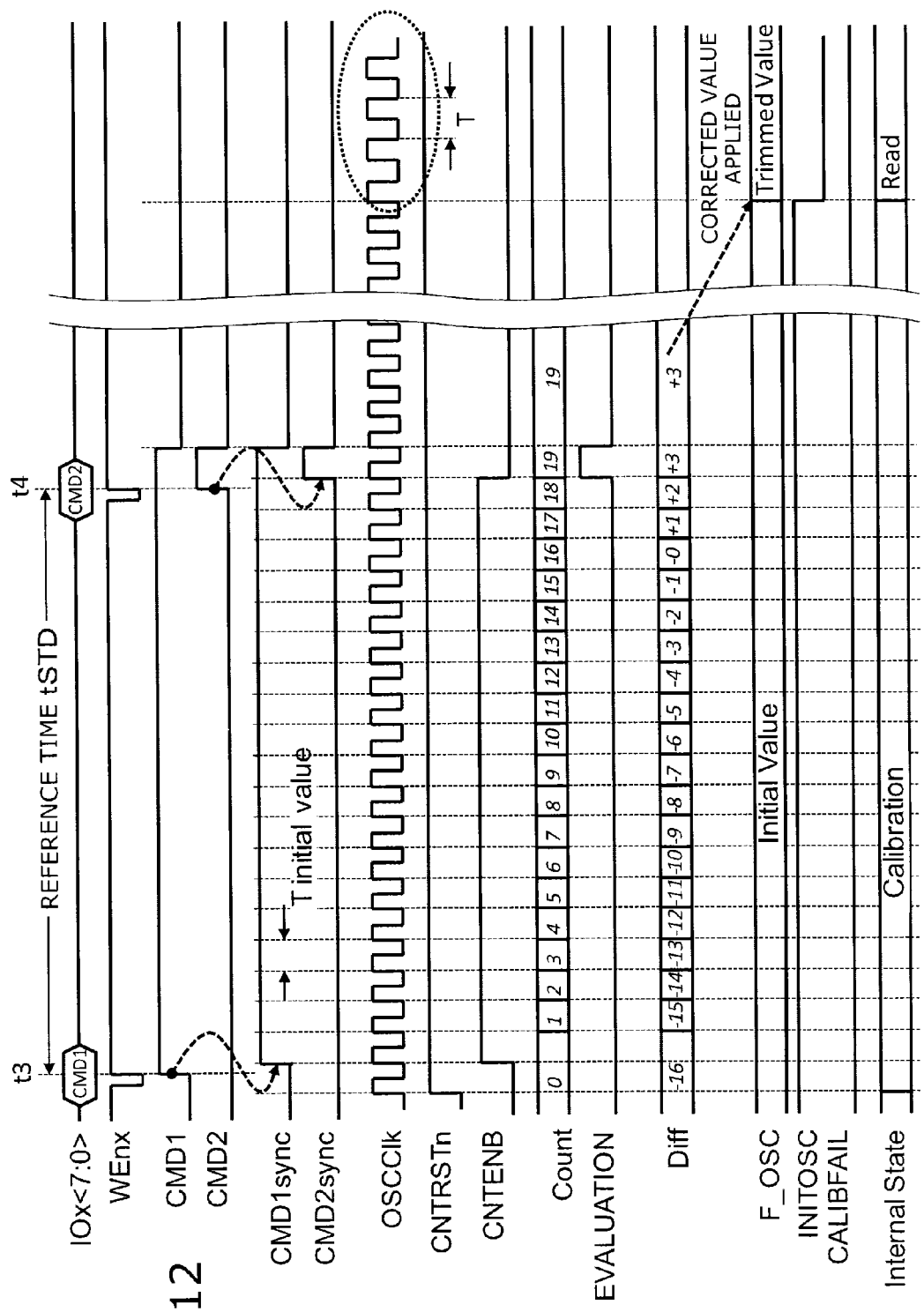
FIG. 12 is a timing chart showing in detail the power-on read method of the first embodiment to show the case where the internal clock OSCClk is faster than the target, where the horizontal axis is time, and the vertical axis is the values of the signals.

FIG. 12 is a timing chart showing in detail the power-on read method of the embodiment to show the case where the internal clock OSCClk is faster than the target, where the horizontal axis is time, and the vertical axis is the values of the signals.

As shown in FIG. 12, in the case where the internal clock OSCClk is faster than the target, the count value Count increases to exceed "16" because more than 16 periods are within the reference time tSTD. In the example shown in FIG. 12, the count value Count reaches "19". Therefore, the difference value Diff becomes "+3"; and the internal clock OSCClk is corrected to be slower, that is, such that the oscillation period is longer.

Focusing on the period of the internal clock OSCClk, the operations of the device 100 described above can be described sequentially from the startup of the device 100 as follows.

<1> By the oscillation period generation circuit 23c fixing the value of the code signal F_OSC to be the fixed value Initial Value, the oscillator 23d generates the internal clock OSCClk for which the period is determined to be a first period based on the fixed value Initial Value. The first period of the internal clock OSCClk is different between the devices 100.

<2> By the oscillation period generation circuit 23c determining the value of the code signal F_OSC based on the internal clock OSCClk for which the period is determined from the reference time tSTD and <1> recited above, the period of the internal clock OSCClk generated by the oscillator 23d is autonomously corrected to be a second period.

<3> The fuse data is read using the internal clock OSCClk that is corrected to be the second period in <2> recited above.

<4> The period of the internal clock OSCClk is further corrected to be a third period by using the period correction information included in the fuse data that is read in <3> recited above.

<5> The normal operation is performed using the internal clock OSCClk having the third period that is further corrected in <4> recited above.

A method for correcting the period of the internal clock OSCClk based on the count value will now be described.

Figure 13A:
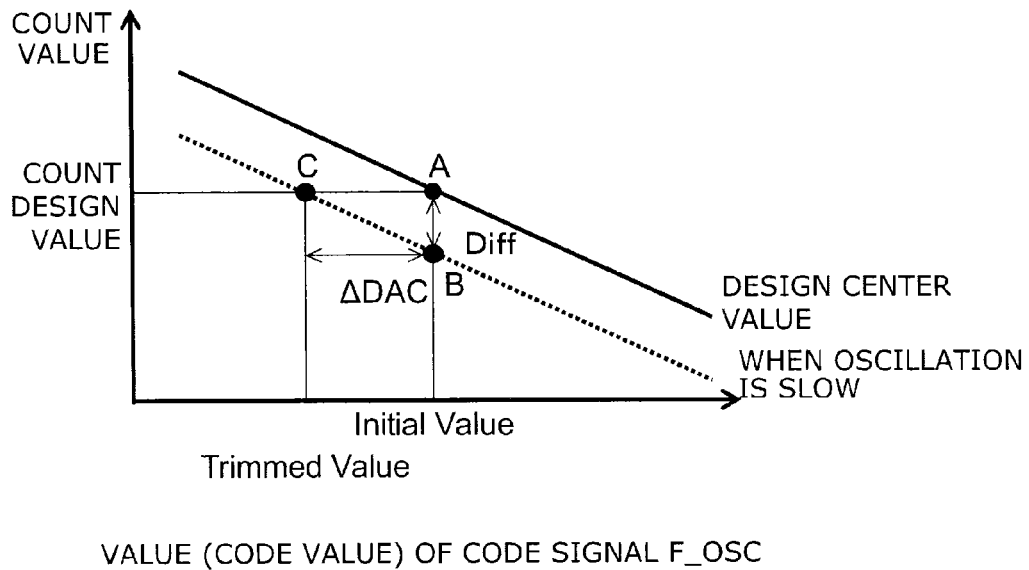
FIGS. 13A and 13B are graphs showing the method for correcting the oscillation period, where the horizontal axis is the value (the code value) of the code signal F_OSC, and the vertical axis is the count value.
Figure 13B:
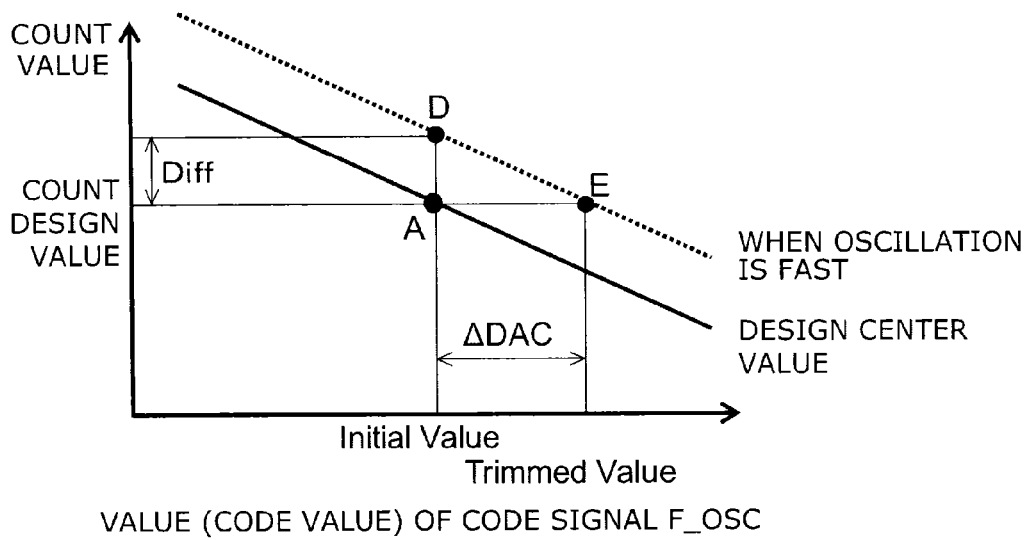

FIGS. 13A and 13B are graphs showing the method for correcting the oscillation period, where the horizontal axis is the value (the code value) of the code signal F_OSC, and the vertical axis is the count value. FIG. 13A shows the case where the oscillation is slower than the design; and FIG. 13B shows the case where the oscillation is faster than the design.

As shown in FIGS. 13A and 13B, for example, the value (the code value) of the code signal F_OSC is taken to be a number proportional to the period of the internal clock OSCClk. In such a case, the oscillation period lengthens and the oscillation becomes slower as the code value input to the oscillator 23d increases. Then, as described above, the count value Count that is ultimately reached and held in the counter circuit 23a decreases as the oscillation becomes slower. In other words, the count value Count decreases as the code value, that is the oscillation period becomes long. In FIGS. 13A and 13B, the solid line illustrates the relationship between the code value and the count value in the case where the oscillation period is the design center value; and the broken line illustrates the relationship between the code value and the count value in the case where the oscillation period is longer than or shorter than the design center value.

Then, as illustrated by point A, the fixed value Initial Value of the code value is set such that the count value Count is set to the count center value in the case where the actual period of the internal clock OSCClk is the design center value. For example, the code value is set to an integer between "0" and "15," the fixed value Initial Value is set to "8," and the count design value is set to "16". However, as described above, the count value Count is not limited to being the count center value when the code value is set to the fixed value Initial Value because the actual oscillation period is different between the devices 100. In other words, the optimal code value to set the count value Count to the count center value is different between the devices 100.

As shown in FIG. 13A, in the case where the actual oscillation is slower than the design, that is, in the case where the oscillation period is longer than the design value, the count value Count is a value that is smaller than the count center value as illustrated by point B when the code value is the fixed value Initial Value. Therefore, the count value Count is corrected to approach the count center value by correcting the code value to be a value that is smaller than the fixed value Initial Value as illustrated by point C. In the example shown in FIG. 9, the count value Count is "14" which is shifted from the count center value (16) by the difference value Diff (−2). Therefore, the code value is set to the corrected value Trimmed Value which is a value ΔDAC, which corresponds to the difference value Diff (−2), added to the fixed value Initial Value (8).

Also, as shown in FIG. 13B, in the case where the actual oscillation is faster than the design, that is, in the case where the oscillation period is shorter than the design value, the count value Count becomes a value greater than the count center value as illustrated by point D when the code value is the fixed value Initial Value. Therefore, as illustrated by point E, the count value Count is corrected to approach the count center value by correcting the code value to be a value greater than the fixed value Initial Value. In the example shown in FIG. 12, the count value Count is "19" which is shifted from the count center value (16) by the difference value Diff (+3). Therefore, the code value is set to the corrected value Trimmed Value which is the value ΔDAC, which corresponds to the difference value Diff (+3), added to the fixed value Initial Value (8).

A method for handling the case where the calibration has failed will now be described.

Figure 14:
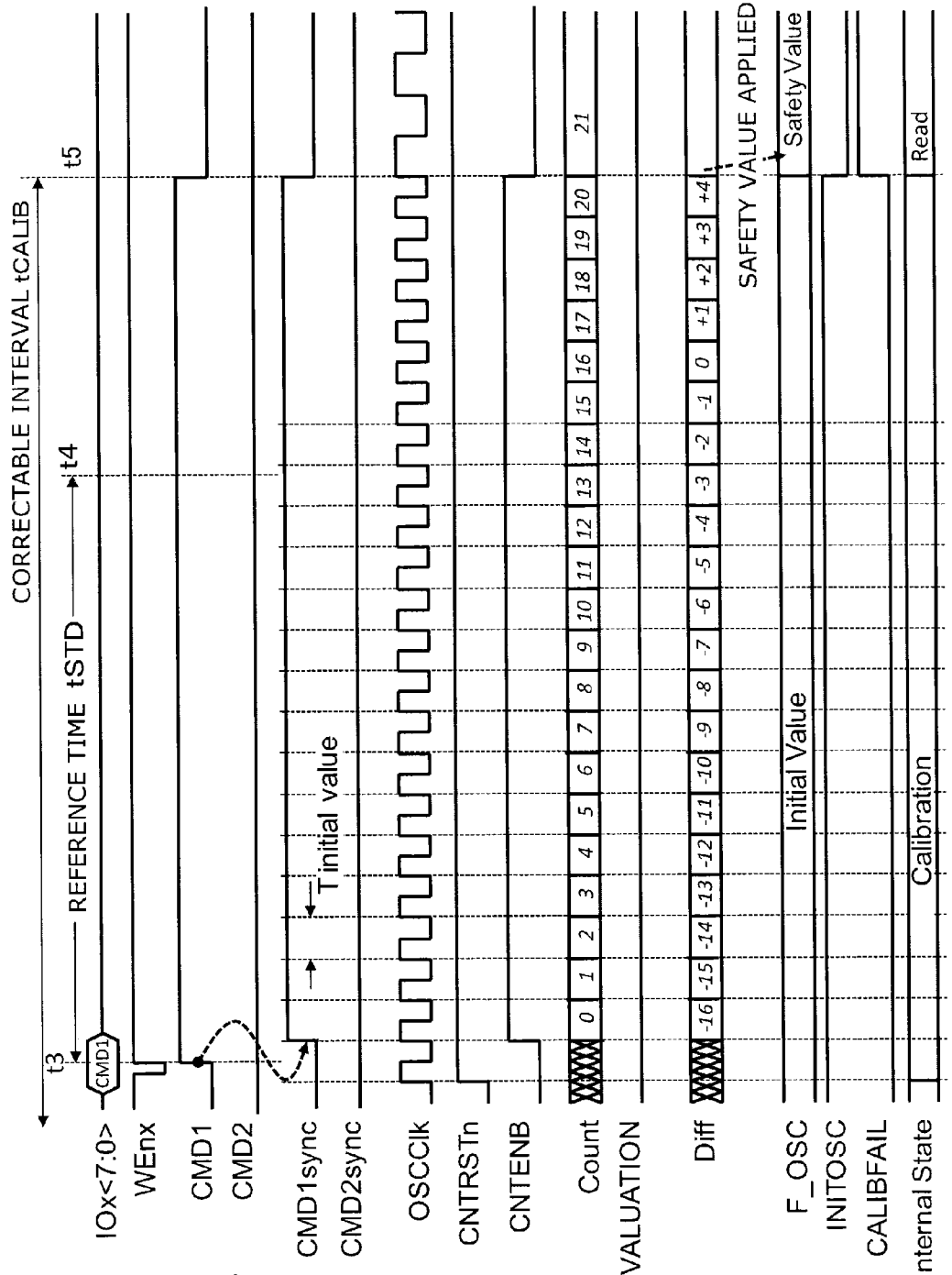
FIG. 14 is a timing chart showing in detail the power-on read method of the first embodiment to show the case where the calibration has failed, where the horizontal axis is time, and the vertical axis is the values of the signals.

FIG. 14 is a timing chart showing in detail the power-on read method of the embodiment to show the case where the calibration has failed, where the horizontal axis is time, and the vertical axis is the values of the signals.

As described above, although it is specified that the commands CDM1 and CDM2 are input from the controller 200 within the reference time tSTD in the device 100, the case may be assumed where the calibration is impossible because either or both of the commands are not input for some reason. In such a case, in the power-on read, the fuse data such as the period correction information, etc., is read by setting the period of the internal clock OSCClk to a predetermined fixed value without correcting the period of the internal clock OSCClk. At this time, the fixed value of the oscillation period is set to be sufficiently long such that the read-out operation can be executed safely even in the case where the period of the internal clock OSCClk is greatly different from the target value.

The operations will now be described in detail.

FIG. 14 shows the case where the command CDM1 that indicates the start of the reference time tSTD is input but the command CDM2 that indicates the end is not input within the correctable interval tCALIB.

As shown in FIG. 14, in the case where the command CDM2 is not input after the command CDM1 is input, the count enable signal CNTENB is not switched to the low level; and the count hold signal EVALUATION is not switched to the high level. Therefore, the counter circuit 23a continues to count synchronously with the internal clock OSCClk and continues to increase the count value Count.

Then, as shown in FIG. 11, when the correctable interval tCALIB ends and time t5 is reached without the command CMD2 being input when the state machine 20 circles around the loop of step S15→step S16→step S20→step S15, the flow proceeds from step S20 to step S21; and the counter circuit 23a is caused to stop counting. Then, as shown in step S22, the state machine 20 switches the failure signal CALIBFAIL to the high level (1). Then, as shown in step S23, the state machine 20 sets the fixed value signal INITOSC to the low level (0).

Continuing as shown in step S30 of FIG. 10, the state machine 20 determines whether or not the calibration succeeded. At this time, the state machine 20 determines that the calibration failed because the failure signal CALIBFAIL is the high level (1). Accordingly, the flow proceeds to step S50; and the predetermined fixed value is used as the period of the internal clock OSCClk.

In other words, at this point in time, as shown in FIG. 3 and FIG. 4, the value of the code signal F_OSC that is output from the oscillation period generation circuit 23c to the oscillator 23d is set to a safety value Safety Value because the power-on read command CMDPOR is the high level (H), the fixed value signal INITOSC is the low level (L), and the failure signal CALIBFAIL is the high level (H). The safety value Safety Value is a value such that the fuse data can be reliably read even in the case where the period of the internal clock OSCClk prior to the correction is greatly different from the design center value; and the safety value Safety Value is, for example, a value that causes the oscillator 23d to set the period of the internal clock OSCClk to the longest period or a value to cause the period of the internal clock OSCClk to be two or three times the period determined by the code signal F_OSCdefault. For example, the safety value Safety Value is taken to be a value that is different from the fixed value Initial Value and different from the corrected value Trimmed Value that is determined from the fixed value Initial Value and the difference value Diff.

Thereby, the clock period used for the power-on read can be sufficiently slow; and the fuse data stored in the fuse region 37 can be read safely.

In the case where the command CDM1 is not input, the flow proceeds from step S19 to step S21 as shown in FIG. 11; and operations similar to those of the operations described above are performed.

Further, as shown in FIG. 8, in the case where the command Status is input at time t6, the state machine 20 responds by outputting the information Info outside the device 100. For example, the failure signal CALIBFAIL is output to the bidirectional bus IOx<7:0> via the selection circuit 17 and the output buffer 13. Thereby, when at least one selected from the commands CDM1 and CDM2 is not input within the correctable interval tCALIB, the peripheral circuit unit 10 communicates this result outside the device 100.

Effects of the embodiment will now be described.

In the embodiment, the period of the internal clock OSCClk is autonomously adjusted in the power-on read in the startup of the nonvolatile memory device 100. Thereby, it is no longer necessary to set the period of the internal clock OSCClk to be excessively long to ensure the safety of the read-out operation; and the information stored in the fuse region 37 can be read in a short period of time. Further, because the period of the internal clock OSCClk is adjusted by an easy method, a long period of time is unnecessary for the calibration itself. As a result, the increase of the startup time can be suppressed even in the case where the capacity of the nonvolatile memory device 100 increases and the fuse data increases.

Further, in the power-on read in which the period correction information cannot be utilized, a clock period that is guaranteed to be within a constant range by the correction is used instead of a clock period that reflects the manufacturing fluctuation. This can eliminate defects of the manufacturing processes, and also can be reduce the risk of misreads. Therefore, the data reliability of the power-on read can be improved.

Moreover, even in the case where the calibration fails, the fuse data can be read by using a predetermined safety value. Although the read-out operation in such a case is slower than in the case where the calibration succeeds, the fuse data can be read reliably; and the transition to the normal operation is possible.

Although an example is illustrated in the embodiment in which four layers of word lines WL are stacked in the stacked body ML and eight memory cell transistors 75 are connected in series to form one memory string Str as shown in FIG. 5 to FIG. 7, the embodiment is not limited thereto. The number of stacks of the word lines WL in the stacked body ML may be three, less than three, five, or more than five; and the source line SL may be disposed below the stacked body ML.

A second embodiment will now be described.

Figure 15:
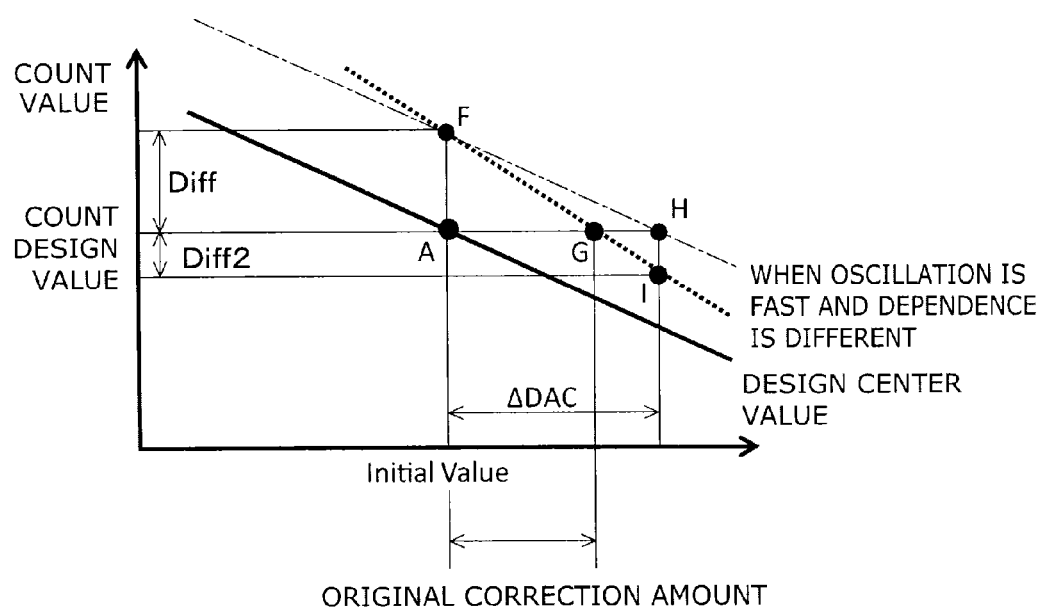
FIG. 15 is a graph showing a method for correcting the oscillation period to show the case where the oscillation is faster than the design and the dependence of the code value of the oscillation period is different from the dependence when the oscillation period is the design center value, where the horizontal axis is the value (the code value) of the code signal F_OSC, and the vertical axis is the count value.

FIG. 15 is a graph showing a method for correcting the oscillation period to show the case where the oscillation is faster than the design and the dependence of the code value of the oscillation period is different from the dependence when the oscillation period is the design center value, where the horizontal axis is the value (the code value) of the code signal F_OSC, and the vertical axis is the count value.

In FIG. 15, the solid line illustrates the relationship between the code value and the count value in the case where the oscillation is as designed; the broken line illustrates the relationship between the code value and the count value in the case where the oscillation is faster than the design; and the single dot-dash line illustrates a straight line that is parallel to the solid line to pass through point F.

In the first embodiment described above as shown in FIGS. 13A and 13B, the dependence of the code value of the oscillation period is unchanging even in the case where the oscillation of the internal clock OSCClk is shifted from the design. In other words, the broken line in FIGS. 13A and 13B is parallel to the solid line.

However, due to the characteristics of the oscillator 23d, there are cases where the dependence of the code value of the oscillation period also changes undesirably in the case where the oscillation is shifted from the design as shown in FIG. 15. In other words, the straight broken line in FIG. 15 that illustrates the relationship between the code value and the count value in the case where the oscillation is faster than the design is non-parallel to the straight solid line that illustrates the relationship in the case where the oscillation is as designed. In such a case, there are cases where the oscillation period does not approach the design center value after the correction even in the case where the oscillation period is corrected by a method similar to that of the first embodiment described above.

In other words, in the case where the oscillation is as designed in FIG. 15, the count value Count becomes the count design value when the code value is the fixed value Initial Value as illustrated by point A. However, in the example shown in FIG. 15, the count value Count becomes greater than the count design value as illustrated by point F because the actual oscillation is faster than the design. In such a case, originally, although the correction should be performed to point G, the correction is undesirably performed toward the target of point H on the single dot-dash line when the oscillation period is corrected based on the difference value Diff similarly to the first embodiment described above; and actually, the correction is performed to point I. Therefore, the correction becomes excessive; and the count value is undesirably lower than the count design value. In other words, the oscillation period becomes longer than the design center value; and the oscillation undesirably becomes slow. Moreover, in some cases, the oscillation period after the correction may be further from the design center value than is the oscillation period prior to the correction; and there is a possibility that the correction may have the opposite effect.

Therefore, in the embodiment, a process is provided to verify the appropriateness of the oscillation period after the correction.

Figure 16:
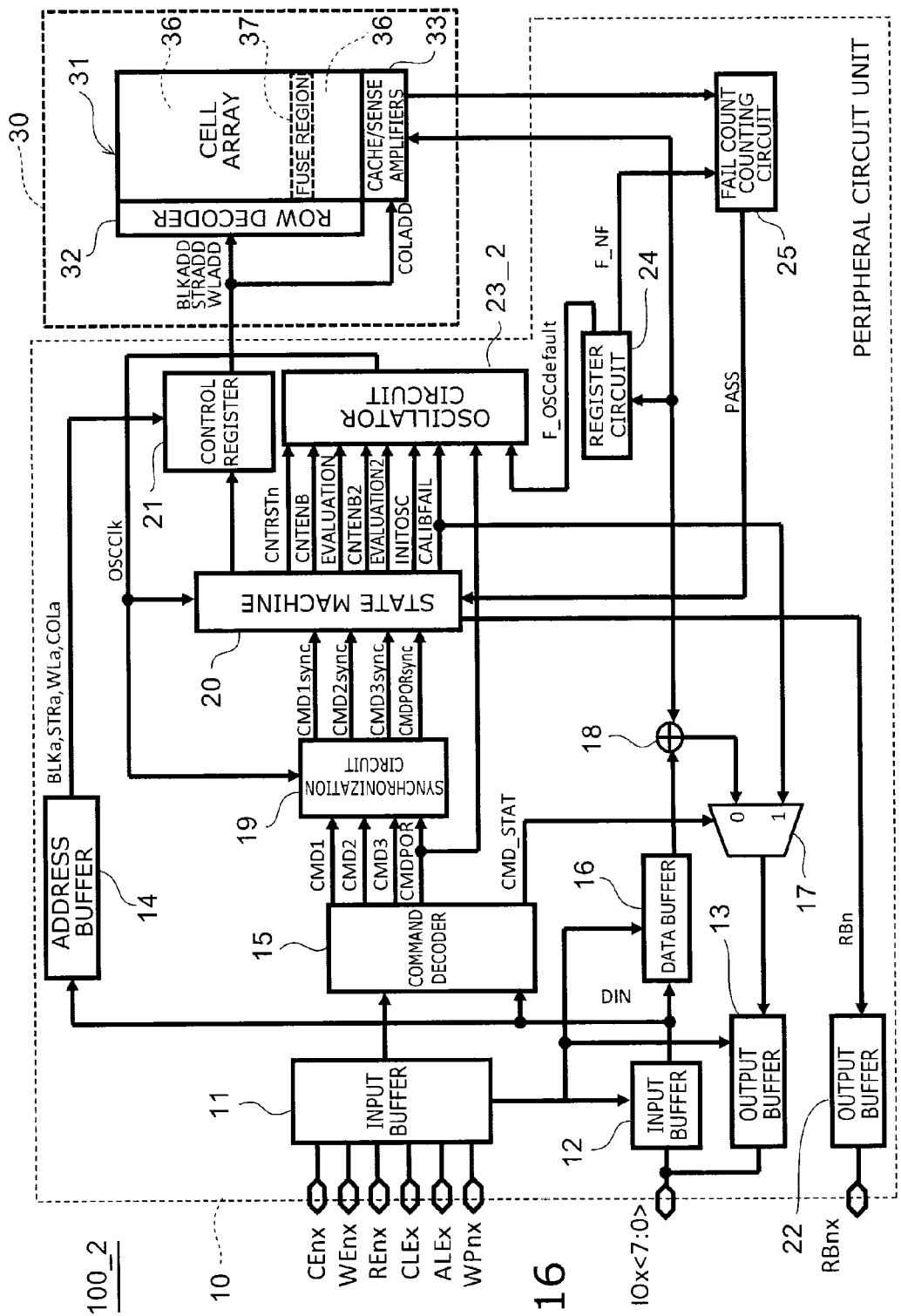
FIG. 16 is a block diagram showing a nonvolatile memory device according to a second embodiment.

FIG. 16 is a block diagram showing the nonvolatile memory device according to the embodiment.

Figure 17:
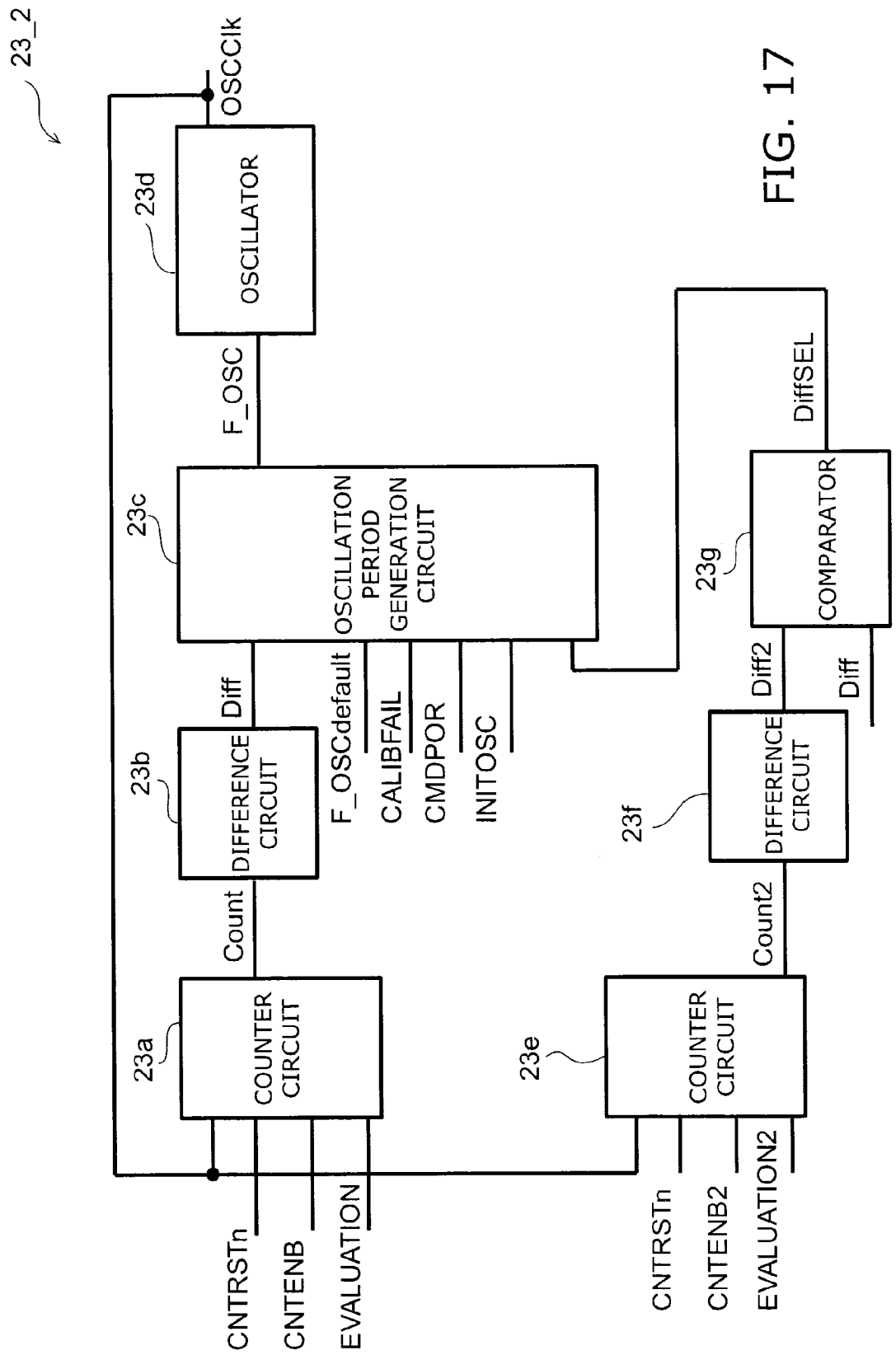
FIG. 17 is a block diagram showing an oscillator circuit shown in FIG. 16.

FIG. 17 is a block diagram showing the oscillator circuit shown in FIG. 16.

FIG. 18 is a drawing showing the relationship between the operating state of the nonvolatile memory device according to the embodiment, the signals input to the oscillation period generation circuit, and the code signal F_OSC that is output.

In FIG. 18, "L" represents the low level (inactive); "H" represents the high level (active); and "*" indicates that either L or H is acceptable.

In the nonvolatile memory device 100_2 according to the embodiment as shown in FIG. 16, in addition to the configuration of the nonvolatile memory device 100 (referring to FIG. 2) according to the first embodiment described above, a command CMD3 is further output from the command decoder 15 to the synchronization circuit 19; a synchronous signal CMD3sync is further output from the synchronization circuit 19 to the state machine 20; and a second count enable signal CNTENB2 and a second count hold signal EVALUATION2 are output from the state machine 20 to an oscillator circuit 23_2.

In the oscillator circuit 23_2 of the embodiment as shown in FIG. 17, in addition to the configuration of the oscillator circuit 23 of the first embodiment described above, a counter circuit 23e, a difference circuit 23f, and a comparator 23g are provided.

The internal clock OSCClk is input from the oscillator 23d to the counter circuit 23e; and the counter circuit 23e counts the number of rises of the internal clock OSCClk. The counter circuit 23e receives from the state machine 20 the inputs of the counter reset signal CNTRSTn that resets the count value of the counter circuit 23e to "0," the count enable signal CNTENB2 that causes the counter circuit 23e to start counting, and the count hold signal EVALUATION2 that causes the counter circuit 23e to stop counting and to hold and output the count value Count2 at that point in time. Similarly to the counter circuit 23a, the counter circuit 23e may include a known counter circuit, e.g., a ripple carry counter circuit, etc.

The count value Count2 is input to the difference circuit 23f from the counter circuit 23e; and the difference circuit 23f calculates the difference between the count value Count2 and a predetermined reference value and outputs a difference value Diff2.

The difference value Diff is input to the comparator 23g from the difference circuit 23b; the difference value Diff2 is input to the comparator 23g from the difference circuit 23f; and the comparator 23g compares the difference value Diff and the difference value Diff2 and outputs the result to the oscillation period generation circuit 23c as a comparison result signal DiffSEL. The difference value Diff is a value that corresponds to the difference between the design center value and the oscillation period prior to the correction; and the difference value Diff2 is a value that corresponds to the difference between the design center value and the oscillation period after the correction. Therefore, if the correction is performed appropriately, the absolute value of the difference value Diff2 should be less than the absolute value of the difference value Diff.

Therefore, in the case where, for example, the absolute value of the difference value Diff2 is less than the absolute value of the difference value Diff, the comparator 23g sets the comparison result signal DiffSEL to the high level (H) due to the correction being appropriate. On the other hand, in the case where the absolute value of the difference value Diff2 is greater than the absolute value of the difference value Diff, the comparison result signal DiffSEL is set to the low level (L) due to the correction being inappropriate.

As shown in FIG. 18, the oscillation period generation circuit 23c of the embodiment differs from that of the first embodiment described above in that the comparison result signal DiffSEL is considered. Namely, in the first embodiment described above as shown in FIG. 4, the code signal F_OSC is constantly set to the corrected value Trimmed Value in the case where the power-on read command CMDPOR is "H," the fixed value signal INITOSC is "L," and the failure signal CALIBFAIL is "L".

Conversely, in the embodiment for the same conditions as shown in FIG. 18, the code signal F_OSC is set to the corrected value Trimmed Value only in the case where the comparison result signal DiffSEL is "H," that is, only in the case where the absolute value of the difference value Diff2 is less than the absolute value of the difference value Diff and it is determined that the correction is appropriate. On the other hand, the code signal F_OSC is set to the fixed value Initial Value in the case where the comparison result signal DiffSEL is "L," that is, in the case where the absolute value of the difference value Diff2 is greater than the absolute value of the difference value Diff and it is determined that the correction is inappropriate.

Operations of the nonvolatile memory device according to the embodiment will now be described.

Figure 19:
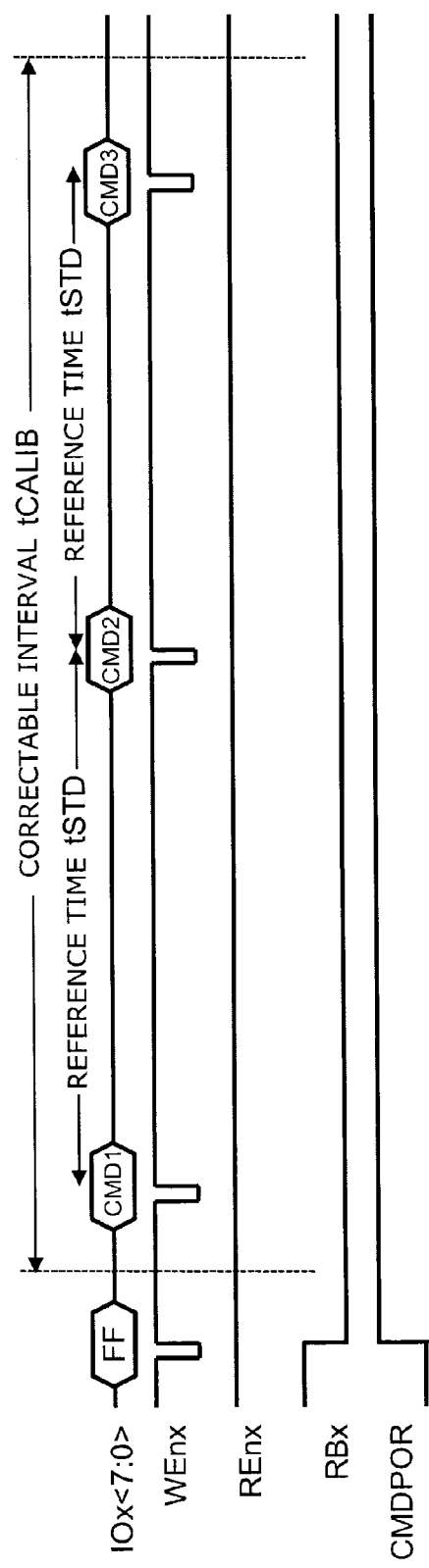
FIG. 19 is a timing chart showing a summary of a calibration and a verification of the second embodiment, where the horizontal axis is time, and the vertical axis is the values of the signals.

FIG. 19 is a timing chart showing the summary of the calibration and the verification of the embodiment, where the horizontal axis is time, and the vertical axis is the values of the signals.

In the embodiment as shown in FIG. 19, the command CMD3, which is the third command, is input after the reference time tSTD from when the command CDM2, which is the second command, is input. Then, a calibration similar to that of the first embodiment described above is performed utilizing the reference time tSTD defined by the interval between the command CDM1 which is the first command and the command CDM2 which is the second command; and the appropriateness of the calibration is verified utilizing one other reference time tSTD that is defined by the interval between the command CDM2 which is the second command and the command CMD3 which is the third command.

The details of the verify operation and the internal operations of the device 100_2 will now be described.

Figure 20:
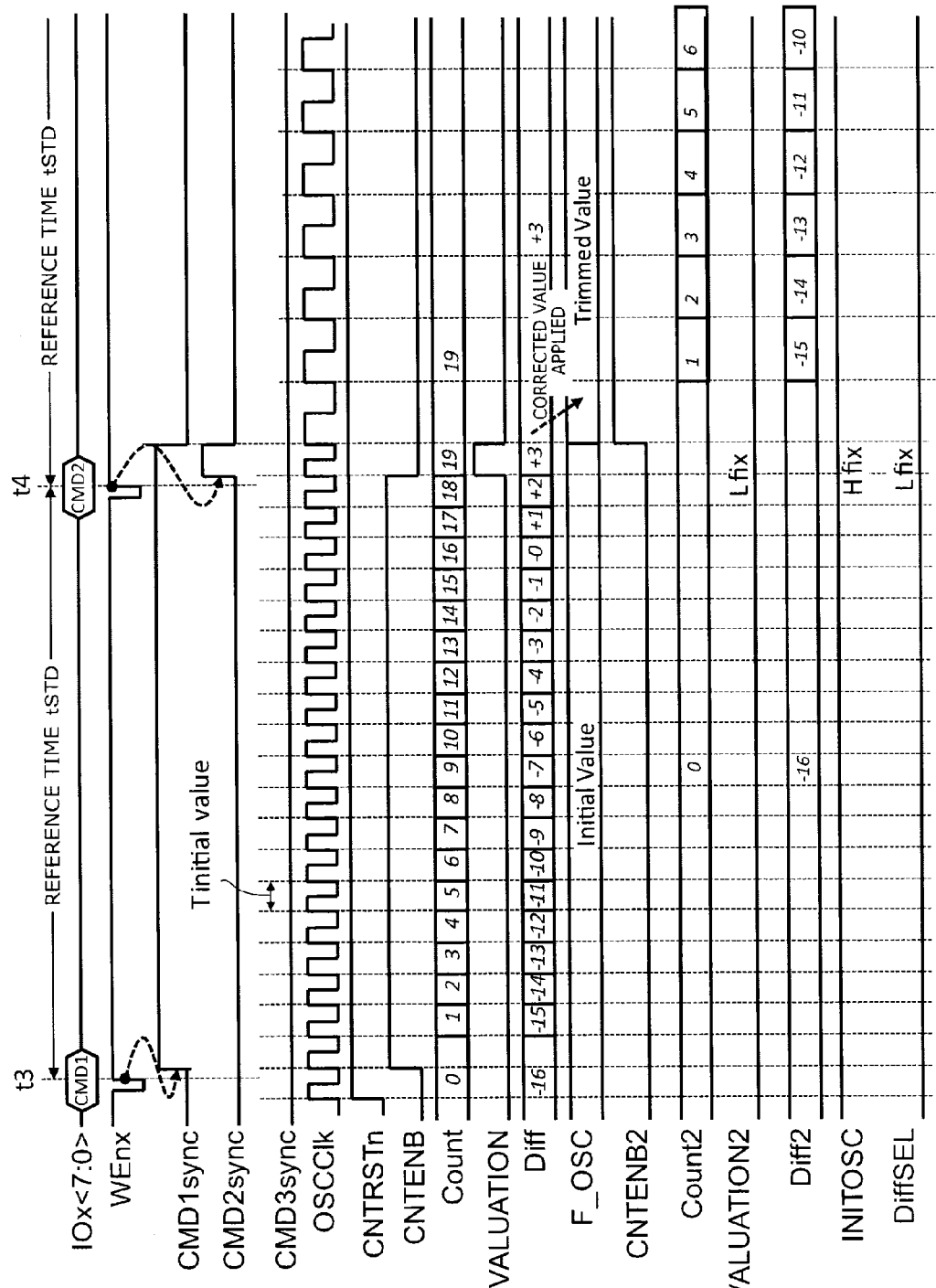
FIG. 20 and FIG. 21 are a timing chart showing in detail the power-on read of the second embodiment, where the horizontal axis is time, and the vertical axis is the values of the signals.
Figure 21:
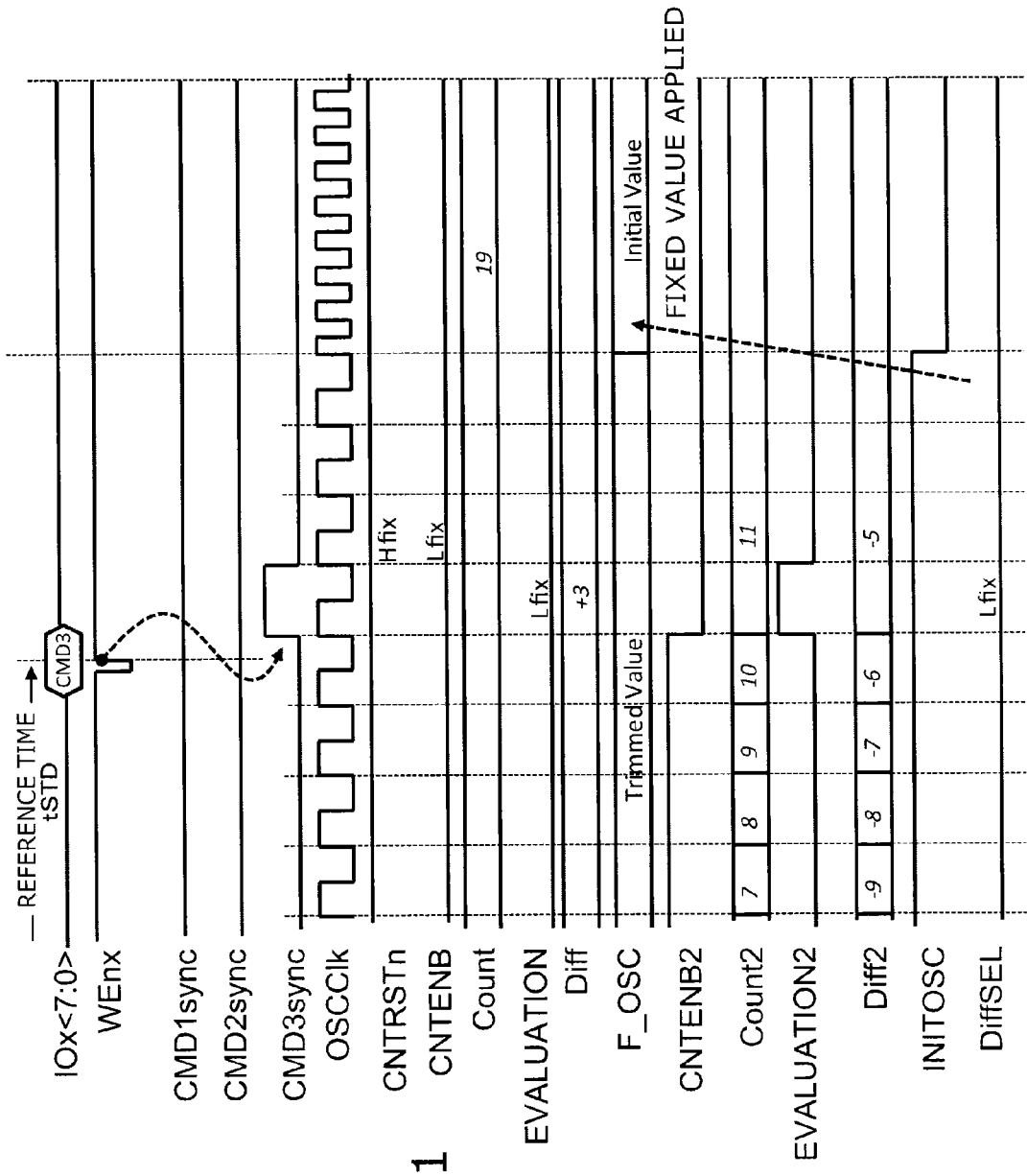

FIG. 20 and FIG. 21 are a timing chart showing in detail the power-on read of the embodiment, where the horizontal axis is time, and the vertical axis is the values of the signals.

Figure 22:
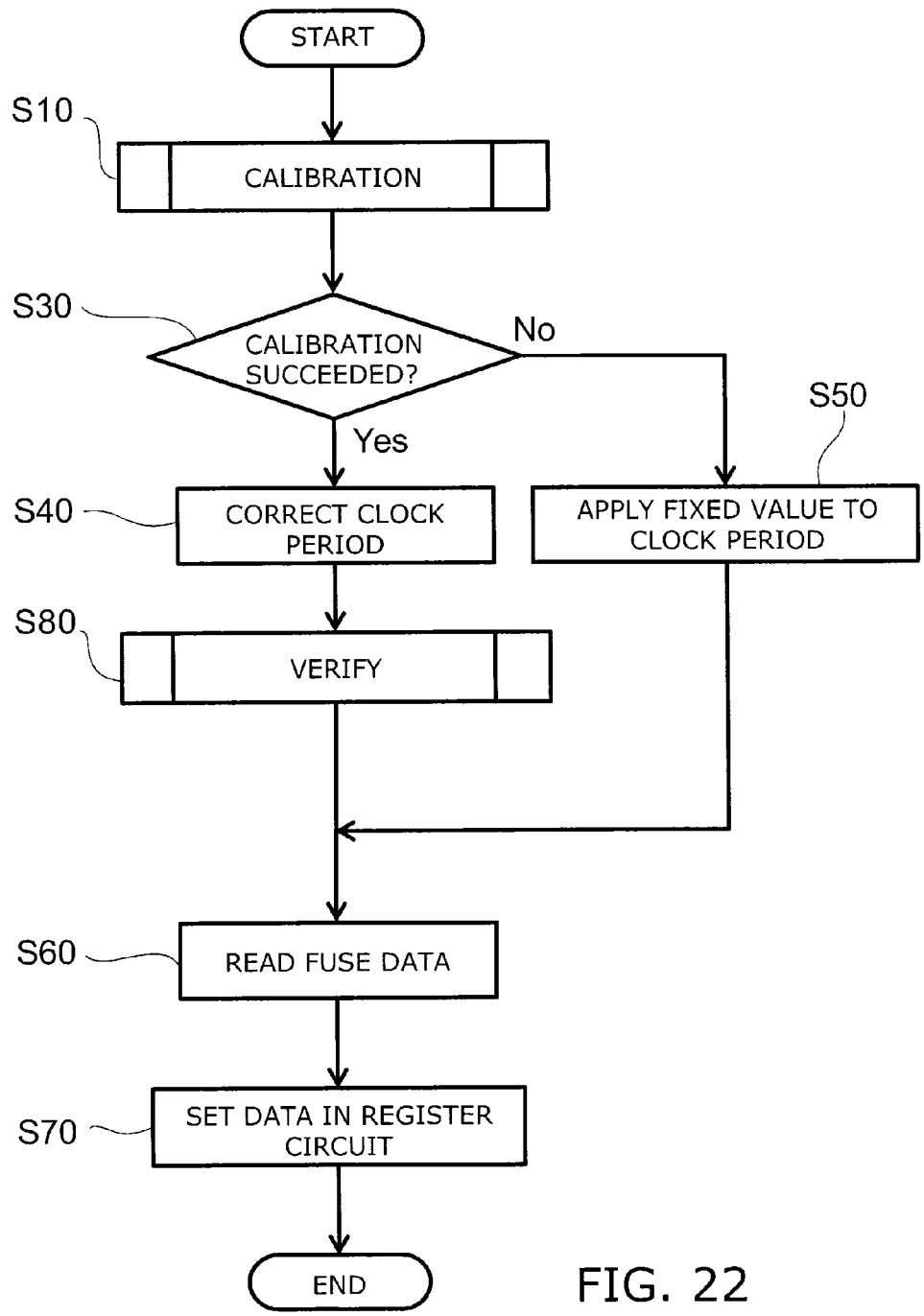
FIG. 22 is a flowchart showing the operations of the state machine in the power-on read of the second embodiment.

FIG. 22 is a flowchart showing the operations of the state machine in the power-on read of the embodiment.

Figure 23:
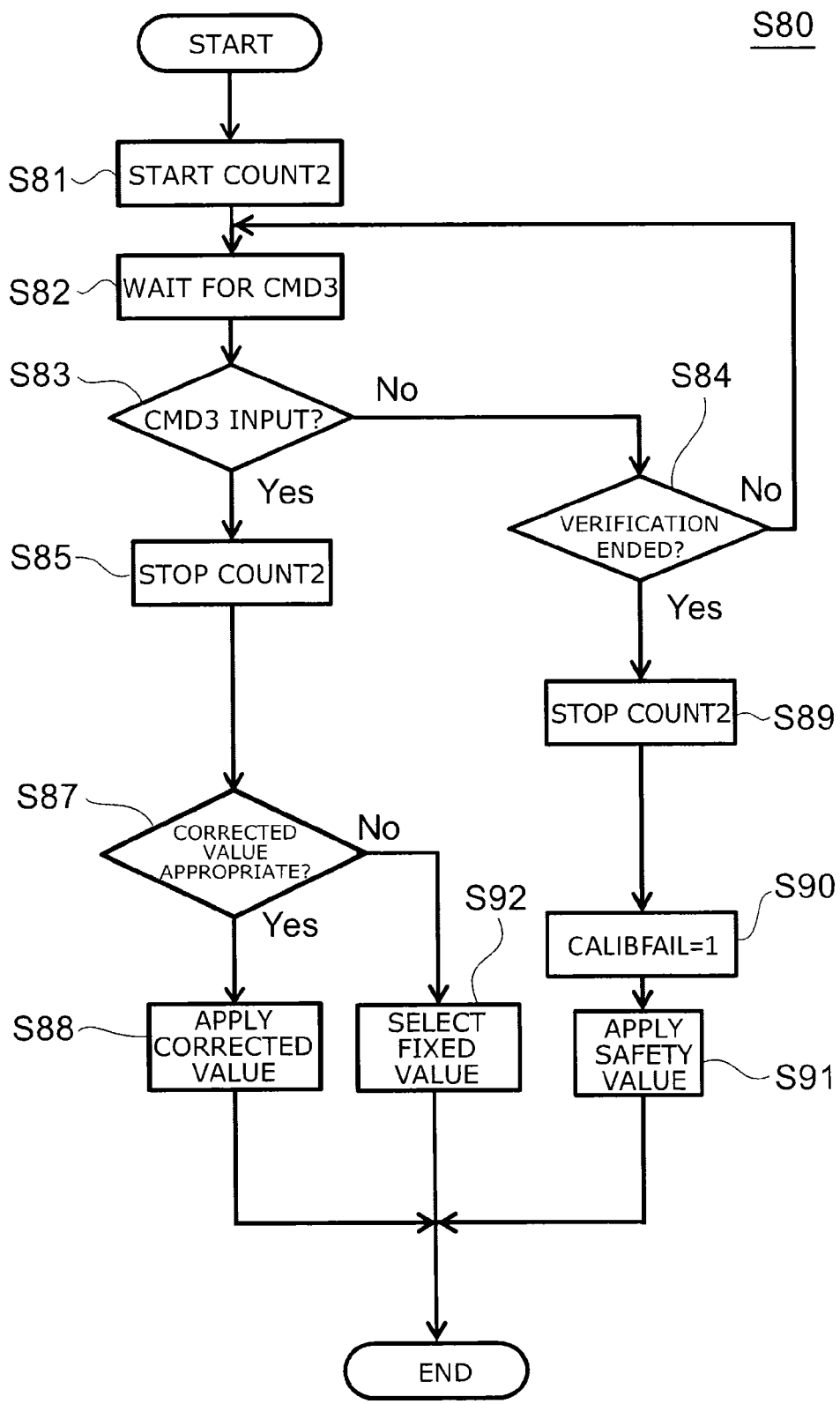
FIG. 23 is a flowchart showing a subroutine S80 shown in FIG. 22.

FIG. 23 is a flowchart showing the subroutine S80 shown in FIG. 22.

The operations shown in FIG. 21 are operations continuing from the operations shown in FIG. 20. The power-on read of the embodiment includes the verification of the appropriateness of the calibration in addition to the calibration and the reading of the fuse data. The verification is implemented after the calibration and prior to the reading of the fuse data.

As shown in FIG. 19 to FIG. 23, the operations of the calibration are similar to those of the first embodiment described above. In other words, in the calibration shown in step S10 of FIG. 22, the counter circuit 23a counts the number of periods of the internal clock OSCClk within the reference time tSTD defined by the interval between the command CDM1 and the command CDM2; the difference circuit 23b calculates the difference value Diff between the final count value Count and the reference value; and the corrected value Trimmed Value is calculated based on the difference value Diff. Then, as shown in step S30 of FIG. 22, it is determined whether or not the calibration succeeded; and in the case where the calibration succeeded, the flow proceeds to step S40, and the period of the internal clock OSCClk is corrected to a period based on the corrected value Trimmed Value.

Then, as shown in step S80, the appropriateness of the calibration is verified. In other words, as shown in step S81 of FIG. 23, the state machine 20 causes the count enable signal CNTENB2 to rise from the low level to the high level synchronously with the synchronous signal CDM2sync to cause the counter circuit 23e of the oscillator circuit 23_2 to start counting the period of the internal clock OSCClk after the correction.

Subsequently, as shown in step S82 of FIG. 23, the state machine 20 is switched to the state of waiting for the input of the command CMD3 and circles around the loop of step S82→step S83→step S84→step S82 until the command CMD3 is input or the correctable interval tCALIB elapses.

Then, the command decoder 15 outputs the command CMD3 to the synchronization circuit 19 when the command CMD3 is input to the input buffer 12 synchronously with the transition to the low level of the write enable signal WEnx that is input to the input buffer 11 of the device 100_2 by the controller 200 (referring to FIG. 1). The synchronization circuit 19 causes the synchronous signal CMD3sync to rise from the low level to the high level at the timing at which the internal clock OSCClk first rises from the low level to the high level after the command CMD3 is input.

When the synchronous signal CMD3sync is switched to the high level, the state machine 20 determines that the command CMD3 has been input, proceeds from step S83 to step S85 of FIG. 23, switches the count enable signal CNTENB2 from the high level to the low level, and switches the count hold signal EVALUATION2 from the low level to the high level. Thereby, the counter circuit 23e stops counting and holds the count value Count2 at this time. As a result, the value of the difference value Diff2 that is output by the difference circuit 23f also is fixed. In the example shown in FIG. 21, the final count value Count2 is "11"; and the difference value Diff2 is "−5".

Then, as shown in step S87, it is evaluated whether or not the corrected value that is applied in step S40 of FIG. 22 is appropriate. For example, it is determined that the corrected value is appropriate and the calibration was appropriate in the case where the comparison result signal DiffSEL output from the comparator 23g is the high level (H), that is, in the case where the absolute value of the difference value Diff2 is less than the absolute value of the difference value Diff. On the other hand, in the case where the comparison result signal DiffSEL is the low level (L), that is, in the case where the absolute value of the difference value Diff2 is greater than the absolute value of the difference value Diff, it is determined that the corrected value is inappropriate and the calibration was inappropriate.

In the case where it is determined that the corrected value is appropriate, the flow proceeds to step S88; and the oscillation period generation circuit 23c applies the corrected value Trimmed Value obtained from the calibration as the code signal F_OSC as shown in FIG. 18. On the other hand, in the case where it is determined that the corrected value is inappropriate, the flow proceeds to step S92; and the oscillation period generation circuit 23c applies the previous fixed value Initial Value as the code signal F_OSC as shown in FIG. 18.

In the example shown in FIG. 20 and FIG. 21, the comparison result signal DiffSEL is switched to the low level (L) and it is determined that the corrected value is inappropriate because the difference value Diff is "+3" and the difference value Diff2 is "−5". Therefore, the fixed value Initial Value is applied as a synchronous signal FOSC.

On the other hand, in the case where the command CMD3 is not input within the correctable interval tCALIB due to some error, the flow proceeds from step S84 to step S89; and the counter circuit 23e is caused to stop. Then, as shown in step S90, the failure signal CALIBFAIL is set to the high level (1). Thereby, as shown in FIG. 18 and step S91, the safety value Safety Value is applied as the synchronous signal FOSC. Thereafter, the operations are similar to those of the first embodiment described above.

The effects of the embodiment will now be described.

According to the embodiment, by verifying the appropriateness of the calibration, an inappropriate internal clock OSCClk can be prevented from being undesirably applied in the power-on read even in the case where the internal clock OSCClk after the correction is intolerably fast or slow as a result of the dependence of the code value of the count value Count greatly fluctuating due to the manufacturing fluctuation of the oscillator 23d, etc. As a result, the information stored in the fuse region can be read more reliably. Otherwise, the configuration, the operations, and the effects of the embodiment are similar to those of the first embodiment described above.

Although an example is illustrated in the embodiment in which the determination of whether or not the calibration is appropriate is performed by comparing the absolute value of the difference value Diff and the absolute value of the difference value Diff2, the embodiment is not limited thereto. For example, the correction amount of the value (the code value) of the code signal F_OSC may be determined from the difference value Diff2; and this correction amount may be compared to the correction amount determined from the difference value Diff.

Also, although an example is illustrated in the embodiment in which the fixed value Initial Value is employed as the code signal F_OSC in the case where it is determined that the calibration is inappropriate, the embodiment is not limited thereto. For example, the average of the fixed value Initial Value and the corrected value Trimmed Value may be employed as the code signal F_OSC.

Further, although an example is illustrated in the embodiment in which the first reference time tSTD that is defined by the command CDM1 and the command CDM2 is equal to the second reference time tSTD that is defined by the command CDM2 and the command CMD3, the embodiment is not limited thereto; and the two reference times may be different from each other. However, in such a case, it is favorable for the comparison of the difference value Diff and the difference value Diff2 to be performed on normalized values.

A third embodiment will now be described.

In the nonvolatile memory device 100 as shown in FIG. 5 and FIG. 6, multiple, e.g., eight, memory cell transistors 75 are connected in series by one U-shaped silicon member 73. Each U-shaped silicon member 73 forms a memory string Str.

However, in the case where the device 100 is downscaled, there is a possibility that the through-hole 61 that pierces the stacked body ML may undesirably clog or the silicon pillar 71 may become too small and undesirably break in the manufacturing processes. In the case where the silicon pillar 71 becomes too small, the characteristics of the memory cell transistor 75 become defective. Also, in the case where the silicon pillar 71 undesirably breaks, open defects occur in the memory string Str; and all of the memory cell transistors 75 belonging to the memory string Str become unusable. In the case where such formation defects occur in the fuse region 37, the fuse data stored in the fuse region 37 undesirably can no longer be read accurately; and the normal operation is obstructed.

Therefore, as shown in FIG. 7, a method may be considered in which the fuse region 37 includes multiple lines of memory strings Str; the same data is programmed to each of the lines; and the memory string Str that is suitable for the read out is selected when reading. Thereby, the fuse data can have redundancy; and the reliability can be increased.

In the embodiment, the memory string in the fuse region 37 that is suitable for the read out is searched for by utilizing the internal clock OSCClk that is corrected.

Figure 24:
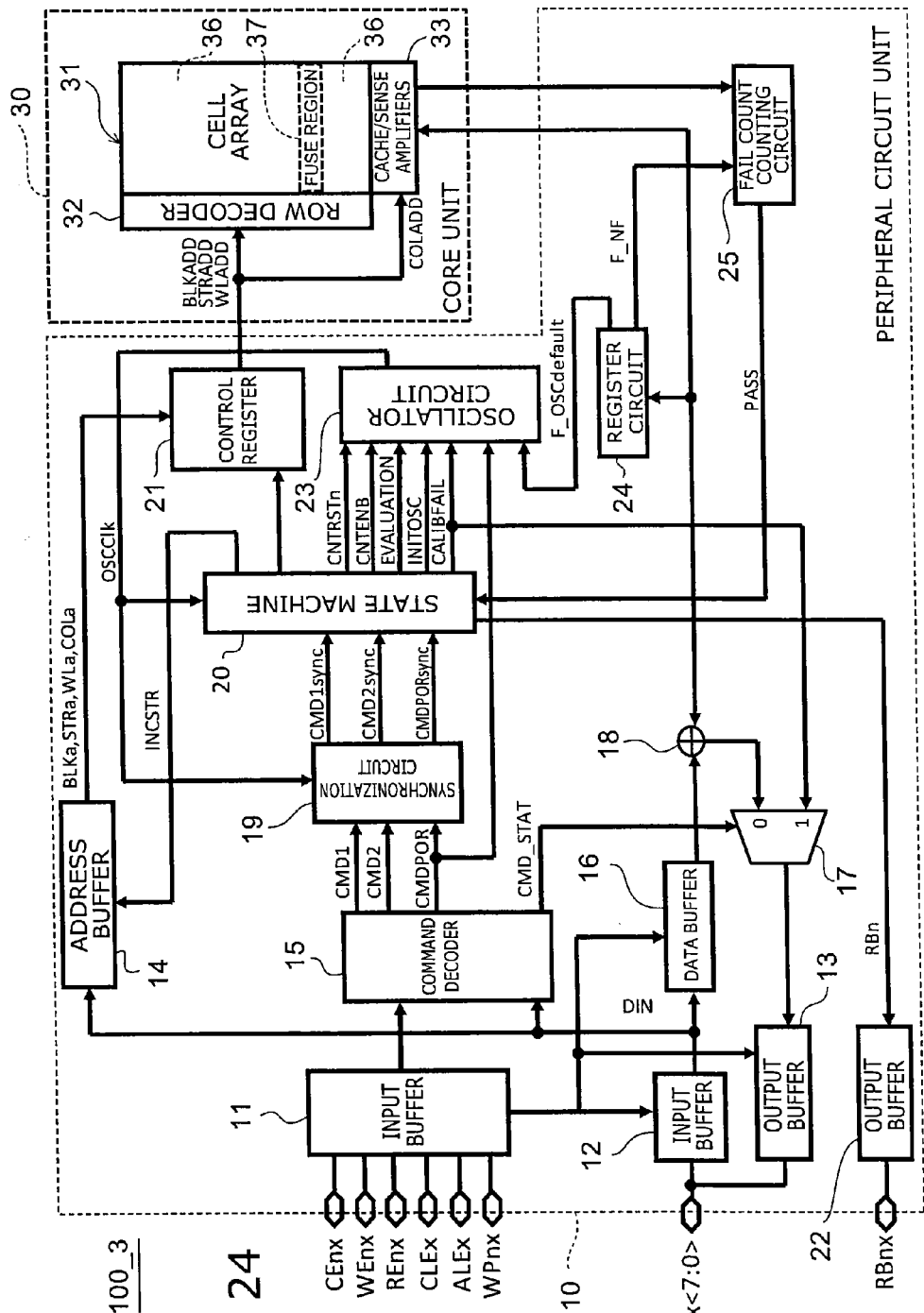
FIG. 24 is a block diagram showing a nonvolatile memory device according to a third embodiment.

FIG. 24 is a block diagram showing the nonvolatile memory device according to the embodiment.

As shown in FIG. 24, the nonvolatile memory device 100_3 according to the embodiment differs from the nonvolatile memory device 100 (referring to FIG. 2) according to the first embodiment described above in that an instruction signal INCSTR is output from the state machine 20 to the address buffer 14. The instruction signal INCSTR is a signal in which the value of the string address signal STRADD is increased one at a time.

Further, as shown in FIG. 7, four lines made of the memory strings Str are provided in the fuse region 37; and the same fuse data is stored in each of the lines.

Operations of the nonvolatile memory device according to the embodiment will now be described.

Figure 25:
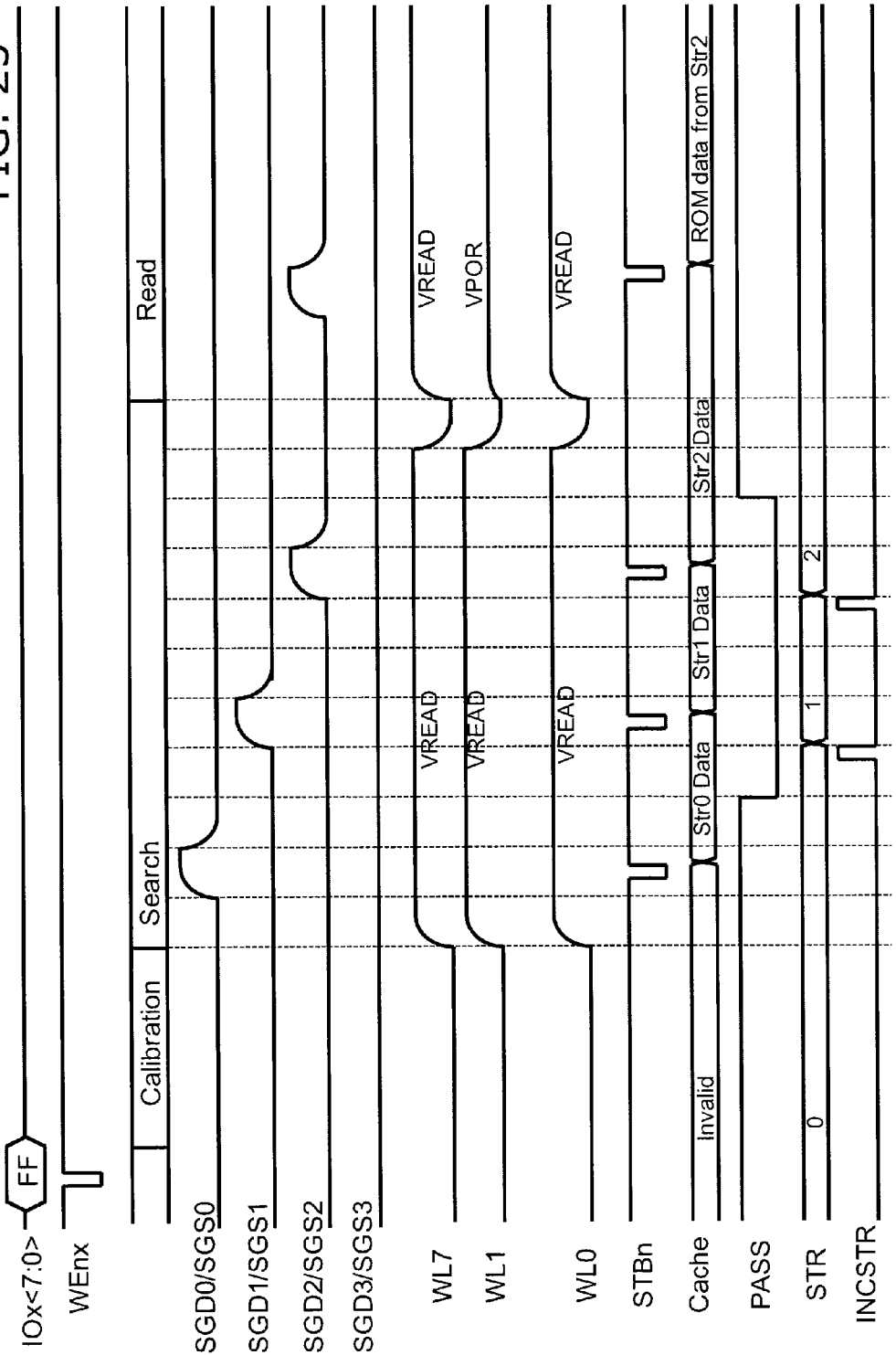
FIG. 25 is a timing chart showing a search operation of a memory string line that is suitable for a read out of the third embodiment, where the horizontal axis is time, and the vertical axis is the values of the signals.

FIG. 25 is a timing chart showing the search operation of the memory string line that is suitable for the read out of the embodiment, where the horizontal axis is time, and the vertical axis is the values of the signals.

Figure 26:
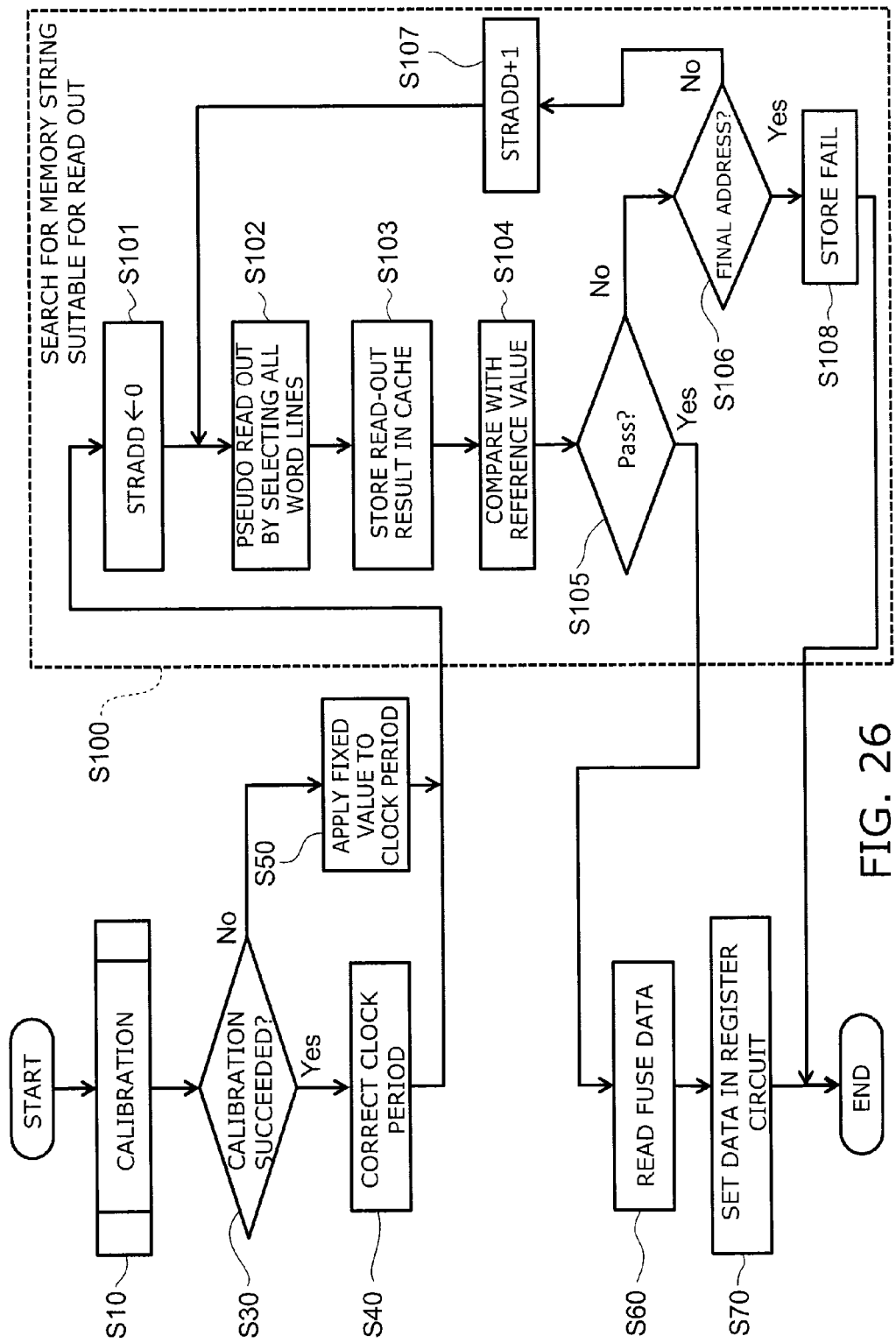
FIG. 26 is a flowchart showing operations of a state machine of the third embodiment.

FIG. 26 is a flowchart showing the operations of the state machine of the embodiment.

First, as shown in steps S10 to S50 of FIG. 25 and FIG. 26, the period of the internal clock OSCClk is corrected by performing the calibration using a method similar to that of the first embodiment described above.

Then, as shown in step S100 of FIG. 26, the memory string Str that is suitable for the read out are searched for in the fuse region 37 using the internal clock OSCClk that is corrected. The search method shown in step S100 will now be described in detail.

First, as shown in step S101, the value "0" is substituted in the string address signal STRADD. Thereby, the memory string Str0 of the fuse region 37 is selected.

Then, as shown in step S102, a read-out unselect potential VREAD is applied to all of the word lines WL. Thereby, all of the memory cell transistors 75 are switched to the on-state regardless of whether or not charge is stored in the charge storage layers 66. Also, a potential is applied to the back gate BG such that the back gate transistor 77 is switched to the on-state. Further, a pseudo read out is implemented by activating (active-low) a signal STBn to enable the sense amplifiers (not shown) of the sense amplifiers/cache 33. The "pseudo read out" is not an operation of reading the data stored in the memory cell transistors 75 but is an operation to sense whether or not there is a formation defect in the memory string Str.

Specifically, the on-state potential is set such that the selection gate electrodes SGb0 and SGs0 belonging to the memory string Str0 that is selected are charged and the selection transistors 76 are switched to the on-state. At this time, for the other selection gate electrodes SGb1 to SGb3 and SGs1 to SGs3, the off-potential remains as-is such that the electrodes are not charged the selection transistors 76 are switched to the off-state. Thereby, a current flows in the memory string Str0 if there are no defects in the memory cell transistors 75, the selection transistors 76, and the back gate transistor 77 that belong to the memory string Str0. On the other hand, a current does not flow in the memory strings Str1 to Str3 because the selection transistors 76 are in the off-state.

Accordingly, if the current flows between the bit line BL and the source line SL, it can be determined that formation defects have not occurred in the memory string Str0 connected between the bit line BL and the source line SL. On the other hand, if the current does not flow between the bit line BL and the source line SL, it can be determined that there is a defect in the memory string Str0 connected between the bit line BL and the source line SL. As shown in step S103, the result of the pseudo read out is stored in the cache (not shown) of the sense amplifiers/cache 33.

Then, as shown in step S104, based on the data stored in the sense amplifiers/cache 33, the number of defective bits is calculated using a known defective bit test and compared to a reference value. For example, the fail count reference value F_NF that is held by the register circuit 24 is used as the reference value.

Continuing as shown in step S105, the suitability/unsuitability of the memory string Str0 that is selected is determined. For example, if the number of defective bits is not more than the fail count reference value F_NF, it is determined that the memory string Str0 is suited to the reading of the fuse data; and the signal PASS that is output by the fail count counting circuit 25 is set to the high level. On the other hand, if the number of defective bits is larger than the fail count reference value F_NF, it is determined that the memory string Str0 is not suited to the reading of the fuse data; and the signal PASS is set to the low level. The signal PASS is input to the state machine 20.

In the case where it is determined that the memory string Str0 is suited to the reading of the fuse data, the value of the string address signal STRADD is still held at "0"; and the flow proceeds to step S60. On the other hand, in the case where it is determined that the memory string Str0 is not suited to the reading of the fuse data, the flow proceeds to step S106; and it is determined whether or not the memory string Str that is selected is at the final address. In the example shown in FIG. 7, because the final address is for the memory string Str3 and the memory string Str0 is not at the final address, the flow proceeds to step S107; and 1 is added to the value of the string address signal STRADD due to the instruction signal INCSTR. Thereby, the value of the string address signal STRADD becomes "1"; and the memory string Str1 is selected. Thus, the value of the string address signal STRADD is increased one at a time each time it is determined that one memory string Str is not suitable to be read.

Thereafter, the method of steps S102 to S105 is implemented for the memory string Str1. The method is repeated while incrementing the string address signal STRADD until the memory string that is suitable for the read out is found. Then, as shown in step S60, the state machine 20 reads the fuse data from the memory string Str that is determined to be suitable for the read out.

On the other hand, in the case where all of the memory strings Str are unsuitable, the flow proceeds from step S106 to step S108; it is recorded that the search failed; and the flow ends. In such a case, at least a portion of the fuse data cannot be read.

In the example shown in FIG. 25, the memory strings Str0 and Str1 are not suited to the reading of the fuse data; and the signal PASS is set to the low level. On the other hand, the memory string Str2 is suited to the reading of the fuse data; and the signal PASS is set to the high level. Accordingly, the flow proceeds to step S60 with the value of the string address signal STRADD remaining set to "2"; and the state machine 20 reads the fuse data from the memory string Str2.

For example, in the case where the data is read from the memory cell transistor 75 that belongs to the memory string Str2 and has the word line WL1 as the gate electrode, a read-out select potential VPOR is applied to the word line WL1; and the read-out unselect potential VREAD is applied to the word lines WL other than the word line WL1. Thereby, the data can be read by sensing the threshold of the memory cell transistor 75.

Then, as shown in step S70, the fuse data that is read is set in the register circuit 24.

Effects of the embodiment will now be described.

According to the embodiment, the fuse data can have redundancy by pre-storing the same fuse data in multiple lines of the memory strings Str and autonomously searching for the memory string that is appropriate when reading the fuse data. Thereby, the fuse data can be read reliably even in the case where a portion the memory cell transistors in the fuse region has formation defects due to defects of the manufacturing processes, etc. In particular, the effects are effective in the case where a three-dimensionally stacked structure such as that shown in FIG. 5 and FIG. 6 is used as the cell array 31 because the through-holes clog easily when downscaling or when the number of stacks is increased.

Also, in the embodiment, the search operation described above can be performed reliably in a short period of time because the search operation is performed using the internal clock OSCClk that is corrected. Otherwise, the configuration, the operations, and the effects of the embodiment are similar to those of the first embodiment described above.

A modification of the third embodiment will now be described.

Figure 27:
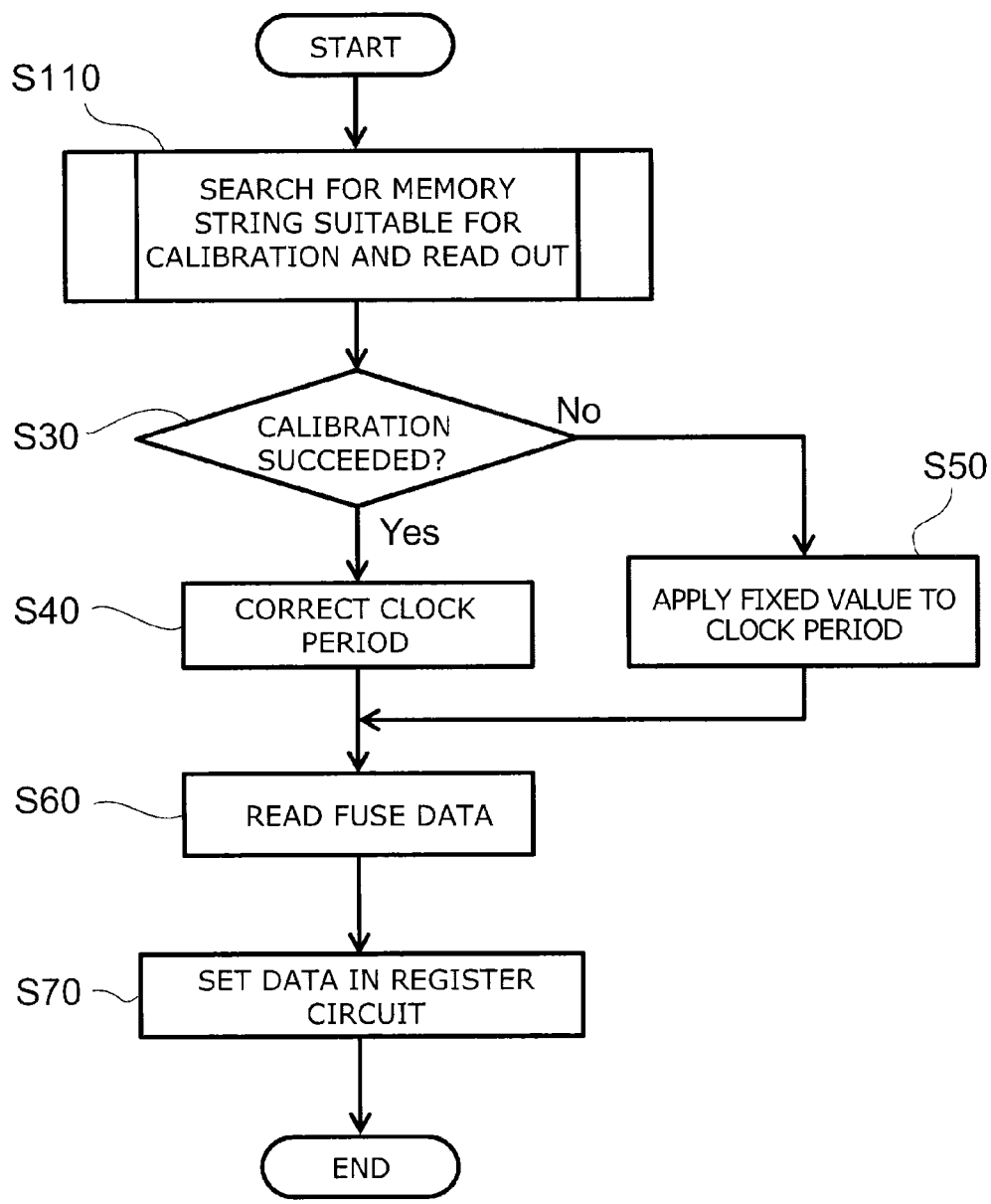
FIG. 27 is a flowchart showing operations of a state machine of a modification of the third embodiment.

FIG. 27 is a flowchart showing the operations of the state machine of the modification.

In the modification as shown in FIG. 27, the "calibration" operation shown in step S10 of FIG. 10 is replaced with the "search for memory string suitable for calibration and read out" operation shown in step S110.

In the "search for memory string suitable for calibration and read out" operation shown in step S110 of FIG. 27, the calibration operation described in step S10 of the first embodiment described above and the search operation described in step S100 of the third embodiment described above are implemented simultaneously in parallel. In other words, the search interval of the memory string that is suitable for the read out is disposed to overlap the correctable interval tCALIB described above in the data sheet. Although the search operation is performed using the internal clock OSC-Clk prior to the correction in such a case, problems do not occur because rigorous timing control is unnecessary in the pseudo read out.

According to the modification, by simultaneously performing the calibration and the search, the time necessary for the power-on read can be reduced further; and the nonvolatile memory device can be started up more quickly. Otherwise, the configuration, the operations, and the effects of the modification are similar to those of the third embodiment described above.

Although an example is illustrated in the third embodiment and the modification of the third embodiment described above in which the value of the string address STRADD is modified based on the instruction signal INCSTR to select the memory string, this is not limited thereto; and it is sufficient for the memory string that is suitable for the read out to be searched for by implementing the pseudo read out prior to the read-out operation of the fuse data. For example, the value of the string address STRADD may be modified synchronously with the write enable signal WEnx.

Moreover, although an example is illustrated in the embodiments and the modifications of the embodiments described above in which the calibration and the reading of the fuse data are implemented continuously as a series of operations, this is not limited thereto; and only the calibration may be implemented independently prior to the reading of the fuse data.

According to the embodiments described above, a nonvolatile memory device for which the information stored in the fuse region can be read in a short period of time can be realized.

A memory cell array formation may be disclosed in U.S. patent application Ser. No. 12/407,403 filed on Mar. 19, 2009. U.S. patent application Ser. No. 12/407,403, the entire contents of which are incorporated by reference herein.

Furthermore, a memory cell array formation may be disclosed in U.S. patent application Ser. No. 12/406,524 filed on Mar. 18, 2009. U.S. patent application Ser. No. 12/406,524, the entire contents of which are incorporated by reference herein.

Furthermore, a memory cell array formation may be disclosed in U.S. patent application Ser. No. 12/679,991 filed on Mar. 25, 2010. U.S. patent application Ser. No. 12/679,991, the entire contents of which are incorporated by reference herein.

Furthermore, a memory cell array formation may be disclosed in U.S. patent application Ser. No. 12/532,030 filed on Mar. 23, 2009. U.S. patent application Ser. No. 12/532,030, the entire contents of which are incorporated by reference herein.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A nonvolatile memory device, comprising:
   a core unit configured to be capable of storing data; and
   a peripheral circuit unit configured to program and read the data to and from the core unit,
   the peripheral circuit unit being configured to generate an internal clock having a first period and change the first period to be a second period after being input a first command and a second command within an interval,
   wherein the second period is changed to a third period when at least one selected from the first command and the second command is not input within the interval, the third period is longer than the second period.

2. The device according to claim 1, wherein the first period is substantially same as the second period.

3. The device according to claim 1, wherein the peripheral circuit unit is configured to set the interval by being input a start command from the outside.

4. The device according to claim 1, wherein the peripheral circuit unit is configured to output whether or not the first period was changed correctly when a request command is input.

5. The device according to claim 1, wherein the peripheral circuit unit includes:
   a counter circuit configured to count the number of periods of the internal clock having the first period within a first reference time;
   an oscillation period generation circuit configured to output a code signal by being input the number of periods; and
   an oscillator configured to determine the second period by being input the code signal and output the internal clock having the second period.

6. The device according to claim 5, wherein the peripheral circuit unit is configured to verify whether or not the second period is appropriate based on a second reference time input from the outside.

7. The device according to claim 6, wherein the peripheral circuit unit is configured to set the first reference time based on an input time difference of the first command and the second command and set the second reference time based on an input time difference of the second command and a third command, the first to third commands being input from the outside.

8. The device according to claim 1, wherein
   the core unit includes:
   a stacked body including a plurality of insulating films stacked alternately with a plurality of electrode films, the electrode films being divided to be used as a plurality of word lines extending in a first direction;
   a plurality of selection gate electrodes provided on the stacked body to extend in the first direction;
   a plurality of semiconductor pillars extending in a stacking direction of the stacked body to pierce the word lines and the selection gate electrodes;
   a plurality of source lines extending in the first direction to connect to upper end portions of a portion of the semiconductor pillars;
   a plurality of bit lines extending in a second direction intersecting the first direction to connect to upper end portions of the remaining semiconductor pillars;

a connection member connecting a lower end portion of one of the semiconductor pillars to a lower end portion of one other of the semiconductor pillars, the upper end portion of the one of the semiconductor pillars being connected to the source line, the upper end portion of the one other of the semiconductor pillars being connected to the bit line;

a charge storage layer provided between the word lines and the semiconductor pillars; and a gate insulating film provided between the selection gate electrodes and the semiconductor pillars, a memory cell transistor is formed at each intersection between the word lines and the semiconductor pillars, a selection transistor is formed at each intersection between the selection gate electrodes and the semiconductor pillars, and the peripheral circuit unit is configured to apply a potential to two of the selection gate electrodes intersecting two of the semiconductor pillars connected to one of the connection members to switch the selection transistors to an on-state, apply a potential to all of the word lines intersecting the two of the semiconductor pillars to switch the memory cell transistors to the on-state regardless of whether or not a charge is stored in the charge storage layer, and sense a conduction state of a U-shaped pillar made of the one of the connection members and the two of the semiconductor pillars to determine whether or not a memory string made of a plurality of the memory cell transistors sharing the U-shaped pillar is usable.

9. The device according to claim 8, wherein the same data is stored in a plurality of the memory strings, the peripheral circuit unit implements the determining of being usable or not sequentially for the plurality of memory strings, and the same data is read from the memory string determined to be usable.

10. The device according to claim 8, wherein the peripheral circuit unit is configured to hold an address indicating the memory string, and a value of the address is modified each time it is determined that one of the memory strings is not suitable for read out.

11. The device according to claim 1, wherein the peripheral circuit unit is configured to set a first reference time based on an input time difference of the first command and the second command, and the peripheral circuit unit is configured to change the first period to be a second period based on the first reference time.

12. A nonvolatile memory device comprising:

a core unit configured to be capable of storing data and a peripheral circuit unit configured to program and read the data to and from the core unit, the peripheral circuit unit being configured to generate an internal clock having a first period and change the first period to be a second period after being input a first command and a second command within an interval, wherein the peripheral circuit unit, in startup, is configured to:

generate the internal clock having the first period;

correct the first period to be the second period by being input the internal clock having the first period;

read period correction information from the core unit by using the internal clock having the second period; and correct the period of the internal clock to be a third period by using the period correction information, and the peripheral circuit unit is configured to program and read data input from the outside by using the internal clock having the third period.

* * * * *